United States Patent
McMillan et al.

(10) Patent No.: US 10,911,656 B2
(45) Date of Patent: Feb. 2, 2021

(54) OPTICAL ISOLATION SYSTEMS FOR DISPLAYS

(71) Applicant: MICROSOFT TECHNOLOGY LICENSING, LLC, Redmond, WA (US)

(72) Inventors: Christopher John McMillan, Woodinville, WA (US); Raymond Kirk Price, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/820,406

(22) Filed: Nov. 21, 2017

(65) Prior Publication Data
US 2019/0158713 A1    May 23, 2019

(51) Int. Cl.
| | |
|---|---|
| H04N 5/225 | (2006.01) |
| H01L 27/32 | (2006.01) |
| H04N 5/247 | (2006.01) |
| H04N 7/14 | (2006.01) |
| G02B 27/00 | (2006.01) |
| H04N 9/04 | (2006.01) |
| H04N 5/33 | (2006.01) |

(52) U.S. Cl.
CPC ....... H04N 5/2257 (2013.01); G02B 27/0018 (2013.01); H01L 27/3234 (2013.01); H04N 5/247 (2013.01); H04N 7/142 (2013.01); H04N 7/144 (2013.01); H04N 5/33 (2013.01); H04N 9/04 (2013.01)

(58) Field of Classification Search
None
See application file for complete search history.

(56) References Cited

U.S. PATENT DOCUMENTS

| | | | |
|---|---|---|---|
| 6,740,862 | B2 | 5/2004 | Paritsky et al. |
| 8,139,145 | B2 | 3/2012 | Ryu et al. |
| 8,304,707 | B2 | 11/2012 | Lee et al. |

(Continued)

FOREIGN PATENT DOCUMENTS

| | | |
|---|---|---|
| CN | 201203742 Y | 3/2009 |
| CN | 101699344 A | 4/2010 |

(Continued)

OTHER PUBLICATIONS

"Notice of Allowance Issued in U.S. Appl. No. 15/040,872", dated Aug. 21, 2017, 9 Pages.

(Continued)

*Primary Examiner* — Frederick D Bailey
(74) *Attorney, Agent, or Firm* — NovoTechIP International PLLC

(57) ABSTRACT

An optical isolation system is disclosed for use in a display to reduce light that is transmitted from one or more light sources to a camera. The system can include a gasket arranged next to the camera, where the gasket includes an aperture that substantially surrounds a region that is adjacent to a lens of the camera. In some cases, the gasket can reduce optical crosstalk associated with visible light as well as infrared light. The gasket can include a material that is optical opaque to the wavelengths of the light being transmitted. In addition, some layers of the display can include optical disrupting regions formed in a thickness of the layer.

17 Claims, 14 Drawing Sheets

(56) References Cited

U.S. PATENT DOCUMENTS

| | | |
|---|---|---|
| 8,337,620 B2 | 12/2012 | Pei |
| 8,345,129 B2 | 1/2013 | Kanade et al. |
| 8,416,514 B2 | 4/2013 | Kim et al. |
| 8,866,880 B2 | 10/2014 | Tan et al. |
| 9,057,931 B1 | 6/2015 | Baldwin |
| 9,851,478 B2 | 12/2017 | Price et al. |
| 2007/0002130 A1 | 1/2007 | Hartkop |
| 2007/0126912 A1 | 6/2007 | De bruin et al. |
| 2009/0102763 A1 | 4/2009 | Border et al. |
| 2011/0285891 A1 | 11/2011 | Maglaque |
| 2012/0249741 A1* | 10/2012 | Maciocci .................. G06F 3/011 348/46 |
| 2012/0295665 A1 | 11/2012 | Pantfoerder |
| 2013/0286282 A1 | 10/2013 | Yamamoto |
| 2014/0063265 A1* | 3/2014 | Shukla .................. G03B 13/18 348/187 |
| 2014/0313404 A1 | 10/2014 | Miao |
| 2015/0035936 A1* | 2/2015 | Robinson .............. H04N 7/144 348/14.08 |
| 2015/0195437 A1 | 7/2015 | Barringer |
| 2015/0234151 A1* | 8/2015 | Venkataraman ... G02B 13/0015 348/360 |
| 2015/0260988 A1 | 9/2015 | Sugihara et al. |
| 2015/0271392 A1 | 9/2015 | Musgrave et al. |
| 2015/0277000 A1 | 10/2015 | Lee |
| 2016/0241760 A1 | 8/2016 | Law |
| 2016/0337570 A1 | 11/2016 | Tan et al. |
| 2017/0084231 A1 | 3/2017 | Chew |
| 2017/0227686 A1 | 8/2017 | Price et al. |
| 2017/0235398 A1 | 8/2017 | Choi et al. |
| 2018/0357460 A1* | 12/2018 | Smith ..................... G06T 7/74 |

FOREIGN PATENT DOCUMENTS

| | | |
|---|---|---|
| CN | 102395859 A | 3/2012 |
| CN | 104981716 A | 10/2015 |
| JP | 0821974 A | 1/1996 |
| WO | 2007047685 A2 | 4/2007 |
| WO | 2009137022 A1 | 11/2009 |
| WO | 2014188147 A1 | 11/2014 |
| WO | 2015116217 A1 | 8/2015 |
| WO | 2017075103 A1 | 5/2017 |

OTHER PUBLICATIONS

Naik, et al., "A Light Transport Model for Mitigating Multipath Interference in Time-Of-Flight Sensors", In Proceedings of IEEE Conference on Computer Vision and Pattern Recognition, Jun. 7, 2015, pp. 73-81.

"International Search Report and Written Opinion Issued in PCT Application No. PCT/US2017/016309", dated Apr. 4, 2017, 12 Pages.

Danielsen, Laila, "Smartphone Design Trends in 2017", In Publication of Mobility TechZone, Jan. 21, 2017, 3 pages.

Clover, Juli, "2017 iPhone May Feature Edge-to-Edge Display With Embedded Touch ID Sensor, Front-Facing Camera", https://www.macrumors.com/2016/05/11/2017-iphone-edge-to-edge-display/, Published on: May 11, 2016, 2 pages.

"International Search Report and Written Opinion Issued in PCT Application No. PCT/US2018/059917", dated Feb. 4, 2019, 13 Pages.

"First Office Action and Search Report Issued in Chinese Patent Application No. 201780004814.4", dated Dec. 19, 2019, 16 Pages.

"Second Office Action Issued in Chinese Patent Application No. 201780004814.4", dated Aug. 4, 2020, 12 Pages.

* cited by examiner

OPTICAL ISOLATION SYSTEMS FOR DISPLAYS

BACKGROUND

Computing devices and other technologies that include a display are now being used worldwide for a wide variety of tasks. For example, cell phones, tablets, computers and other devices have become the primary tools for the capture and storage of photos. In addition, there is a growing reliance on network-based videoconferencing and video chat applications and services, such as Skype®, Google Chat®, and iChat®, as well as image capture based security systems, such as Windows Hello®.

In order to utilize these applications and systems, the majority of computing devices now include digital cameras or webcams to capture live video or other images. Typically, digital cameras have been associated with the outer perimeter of displays. Bezels on computer displays are often used for placement of camera modules, mounting features, and other physical features needed to make fabrication and assembly of a system possible. In recent years there has been a significant effort to reduce, if not eliminate, the bezel on displays through camera miniaturization and by extending the geometry of the display. Unfortunately, camera modules, LEDs, and other components have physical size, and contribute to the bezel geometry, and cell phone and PC consumers expect the functionality of a camera in their devices. Various techniques have been employed for reducing bezel size as well as improving the quality of video conferencing. However, there remain significant areas for new and improved ideas for application of such techniques.

SUMMARY

An optical isolation system for reducing an amount of light transmitted from a light source in a display to a light receiving portion of a light sensor positioned behind the display is disclosed. The optical isolation system includes a gasket, where the gasket defines an aperture. In addition, the gasket is disposed between the light source and the light receiving portion of the light sensor. The aperture has a first area, the light receiving portion has a second area, and the first area is equal to or greater than second area. Furthermore, the light receiving portion is substantially aligned with the aperture, and the gasket includes a material that is opaque to wavelengths emitted by the light source.

An optical isolation system for reducing an amount of light transmitted from a first light source in a display to two cameras positioned behind the display, including a first camera and a second camera is disclosed. The optical isolation system includes a gasket, where the gasket defines an aperture, and the gasket is disposed between the light source and the two light sensors. In addition, the aperture has a first zone that is equal to or greater than a second zone of the display encompassing a first field of view of the first camera and a second field of view of the second camera. The two cameras are substantially aligned with the aperture. Furthermore, the gasket includes a material that is opaque to wavelengths emitted by the first light source.

An optical isolation system is disclosed that includes a light sensor and a display. The display includes a light source and at least a first layer. The first layer includes a lower surface providing a rear surface of the display, and the light sensor is positioned behind the rear surface of the display. In addition, the lower surface includes a first zone that is adjacent to a light receiving portion of the light sensor, and the lower surface includes an optical disrupting region that extends around the first zone, the optical disrupting region being coated with a material that is opaque to wavelengths emitted by the light source.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

DETAILED DESCRIPTION

Figure 1:
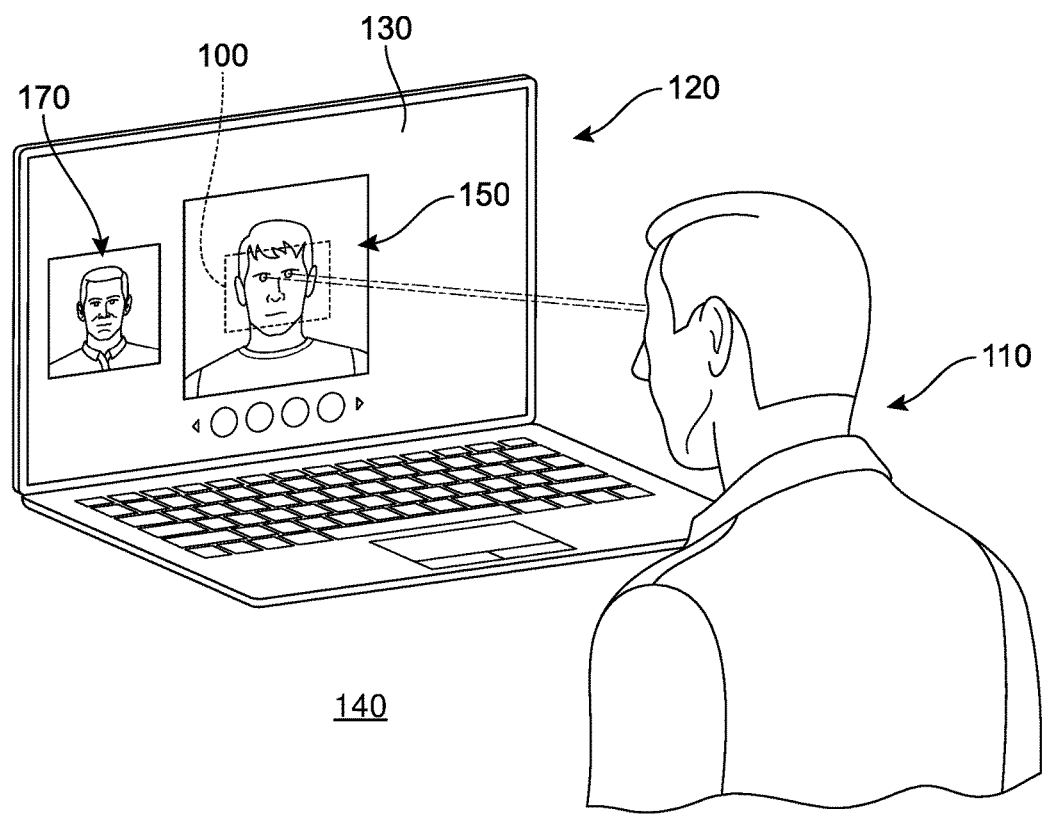
FIG. 1 illustrates an example of a user participating in a videoconference with a monitor that includes a light sensor integrated in the display.

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings. In the following material, indications of direction, such as "top" or "left," are merely to provide a frame of reference during the following discussion, and are not intended to indicate a required, desired, or intended orientation of the described articles.

As noted above, the size of the bezel associated with digital devices has become an increasingly important design factor for consumers. For purposes of this description, the term bezel is used to describe an outside frame or border around a display for a computer or any other computing device. Electronics such as tablet computers and smartphones have been increasingly moving toward a minimal-bezel or even bezel-less design. However, this trend is associated with challenges, as the bezel has conventionally been used for the placement of camera modules, ambient light sensors, microphones, and other mounting components. Thus, there is a growing need for techniques for that permit the reduction or elimination of the display bezel while preserving light sensor functionality and performance.

The following description presents optical isolation systems and methods for the integration of light sensors (such as, but not limited to, RGB (red-green-blue) camera modules and/or infrared (IR) sensing cameras), LED illuminators, and other components behind a display. A display refers to an output device arranged to emit light to present an image indicated by a computing device. In many examples, a display includes a panel including an array of pixel and/or subpixel elements. The disclosed systems permit the integration of a light sensor module (or "light sensor") behind the display while maintaining sensor accuracy, sensor image quality, reasonable exposure times, and a compact system design. This approach can also provide an aesthetically pleasing design, while preserving, among other things, biometric and photo/video performance. Furthermore, the systems and methods described herein can minimize problems such as optical crosstalk. As one example, a gasket may be positioned between a camera lens and the portion of a light-emitting display that is adjacent to the camera. Such a system can reduce the amount of optical crosstalk from the light-emitting display that might otherwise interfere with image capture and/or diminish image quality. Further details regarding these types of systems will be discussed in further detail below.

Many computing devices now include light sensors in the form of digital cameras or webcams to capture live video or other images. In some cases, the captured images can be transmitted or broadcast to at least one other person with whom a user of a computing device is communicating. With respect to videoconferencing, a user will typically be looking at a display screen where video images of another videoconferencing participant is being displayed. In a conventional arrangement in which a camera is positioned outside the display screen, such as in a bezel surrounding the display, to the other participant the user will appear to be looking elsewhere in the captured video information. The resulting "offset" eye-gaze can reduce the impact of a presentation or communication in a video collaboration session. However, by instead placing the camera behind the display, a user can continue to look at images being presented on the display and also maintain the appearance of eye contact with other participants.

For example, referring to FIG. 1, a user 110 is shown in an external environment 140, seated before a computing device 120. In this example, the term "external environment" refers to the environment external to the computing device 120. It is noted that computing device 120 is not limited to the laptop or notebook device illustrated in FIG. 1, and may also be embodied in, among other things, a tablet computing device, a smartphone, a wearable computing device (such as, but not limited to, a smart watch), other mobile and/or portable computing devices, a monitor, a television, and/or an advertising display. The computing device 120 includes a display 130 arranged to display images to the user 110 via a front surface of the display 130 facing the user 110. Included in the display 130 are one or more display light sources, such as, but not limited to, light-emitting pixels or subpixels of an OLED-based display. The computing device 120 also includes a light sensor (not illustrated in FIG. 1) positioned behind a region 100 of the display 130 to receive and sense light received from environment 140 through the display 130. The display 130 is, at least under certain operating conditions, at least partially transparent to the light received and sensed by the light sensor. In this particular example, the light sensor is embodied as an RGB camera or webcam, although the techniques described herein may be applied to other types of light sensors, and may include multiple light sensors (in some cases, including multiple types of light sensors) positioned behind the display 130 and receiving light from the external environment 140 through the display 130.

In FIG. 1, the user is engaged in a video collaboration session with a remote user 150 at a different location. In the video collaboration session, the display 130 presents images of the remote user 150 over or near the region 100 of the display 130 corresponding to a position of the image sensor, and a live feed 170 of images of the user 110 captured by image sensor behind the region 100 of the display 130. The live feed 170 corresponds to images being provided and displayed to the remote user 150 on their own (remote) display. For purposes of clarity, FIG. 1 includes dashed lines indicating a direction of gaze for user 110. It can be seen that the direction of gaze for the user 110 is meeting the gaze of the remote user 150. In other words, the direction of gaze for the user 110 is centered, rather than being offset or averted, and it appears as if the user 110 is actually "looking" at the remote user 150. Much as noted above, in order to achieve this type of visual arrangement, the light sensor that is capturing images of the user 110 has been placed near the center of the display 130, behind a rear surface of the display 130, rather than in a peripheral area outside of the display 130, such as in a bezel. For purposes of example, although in FIG. 1 the light sensor is located in a centrally positioned region 100, though in other implementations, the light sensor and/or one or more additional light sensors can be located elsewhere behind the display 130.

Because the light sensor is positioned behind the display, it can be understood that the light sensor components—such as an optical lens providing a light receiving portion for a camera or other light sensor—may be directly adjacent to a rear surface of the display. In such an arrangement, there is greater exposure of the light sensor to optical crosstalk generated by light sources included in the display. For purposes of this description, a light receiving portion of a light sensor refers to a physical portion of the light sensor via which impinging light may be received by the light sensor and affect measurement of light performed by the light sensor. For example, where a light sensor is embodied as a camera, an optical lens of the camera corresponds to a light receiving portion of the camera. As noted earlier, a significant advantage of the systems and methods described herein is the reduction of optical crosstalk received and detected by a light sensor, and a corresponding degradation of light sensor performance. For purposes of this description, leakage is a term that refers to an (amount of) light that leaks from one image channel into another. Leakage may also be referred to as "crosstalk luminance" and "unintended luminance". In addition, optical crosstalk will refer to the condition in which there is incomplete isolation of two or more image channels, such that the light content from one channel is partly present in another channel. Furthermore, the term ghosting will refer to optical crosstalk sensed by a light sensor.

Thus, it can be understood that crosstalk can be a significant factor affecting image presentation, capture, and quality. With display technologies such as liquid-crystal displays (LCDs), organic light-emitting diode type displays (OLEDs), quantum dot-based displays, various other light-emitting or light generating displays, or other display types integrated with a light sensor positioned behind the display, the effects of optical crosstalk become increasingly challenging. For example, light from a backlight or an OLED material can travel via optical transmission through and along a display and received by a light sensor, affecting its measurements. For example, in some cases, light can be reflected some distance along various layers of a display, resulting in greater optical crosstalk.

Figure 2:
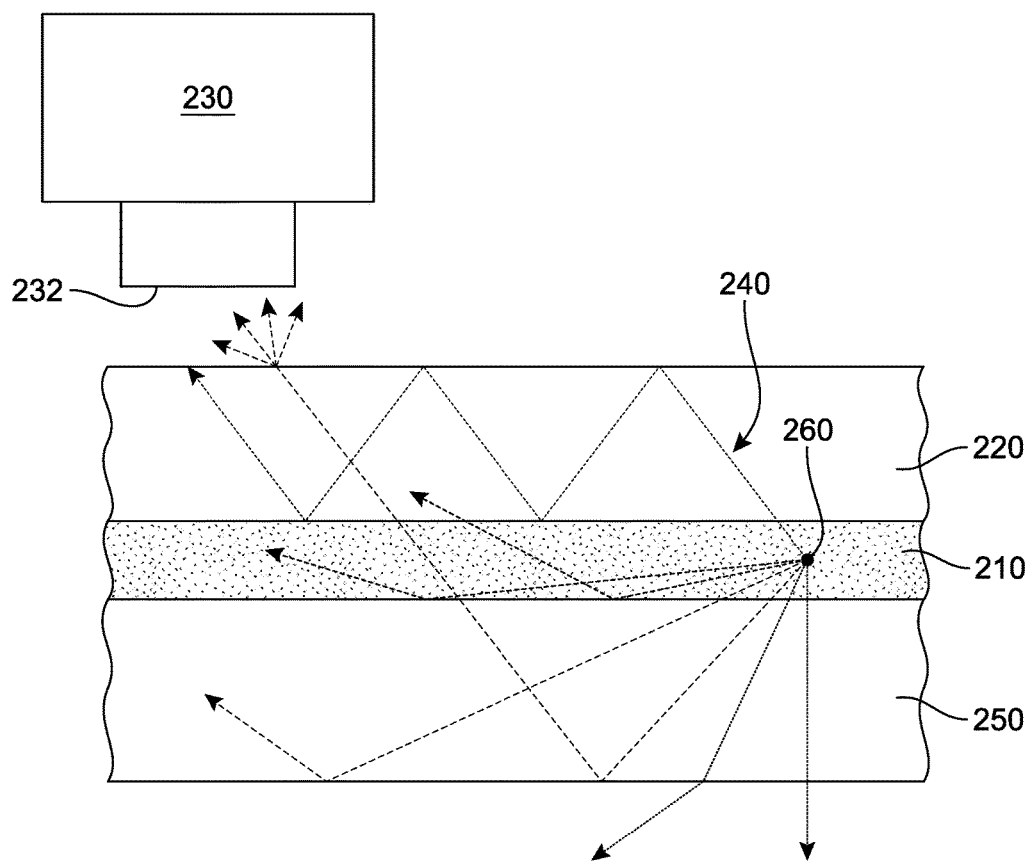
FIG. 2 is a cross-section view of a display with a light-emitting diode that illustrates one example of total internal reflection (TIR)

For purposes of reference, FIG. 2 presents one example of a light-extraction model for an OLED-type display. It should be understood that FIG. 2 is presented simply as an example, and light-extraction of various displays can differ widely. In many cases, only about 20% of the total generated light can escape to the air from conventional OLED devices, due at least in part to internal reflections, including partial internal reflection and total internal reflection (TIR) at various material interfaces having different indices of refraction. For purposes of this description, optical transmission of light due to partial and/or total internal reflection may be referred to as a waveguiding light or waveguiding. In some cases, some of the waveguided light originally emitted by an LED or other display light source can enter a light receiving portion of a light sensor, such as an optical camera lens, thereby degrading or otherwise interfering with measurements performed by the light sensor. In FIG. 2, a plurality of dashed lines 240 emanate from a light source 260 associated with a light-emitting layer 210 of a display that includes, in an OLED-based display, the organic components and a transparent conducting film (TCF), such as indium tin oxide (ITO). The light-emitting layer 210 is positioned between a front layer 250 and a back layer 220. The lines schematically represent the paths or rays of light that is being emitted from the light-emitting layer 210. In this case, internal reflection is illustrated as occurring at two interfaces.

For purposes of this disclosure, one or more of the layers included in a display may be referred to as a two-dimensional material. As utilized with respect to the present invention, the term "two-dimensional material" or variants thereof is intended to encompass generally flat materials exhibiting a length and a width that are substantially greater than a thickness. Accordingly, each layer in the display can be understood to lie substantially flat across a plane. Although two-dimensional materials may have smooth or generally untextured surfaces, some of these two-dimensional materials will exhibit textures or other surface characteristics, such as dimpling, protrusions, ribs, or various patterns, for example. Despite the presence of surface characteristics, two-dimensional materials remain generally flat and exhibit a length and a width that are substantially greater than a thickness. In some implementations, the material can include additional components that are embedded, integrated, formed on, adhered to, or otherwise attached to the material of a layer. However, it can be generally understood that each layer has a flat, elongated and/or two-dimensional geometry.

Furthermore, while for general purposes of this application the layers can be referred to as "two-dimensional", it should be understood that the following disclosure can be readily implemented in displays which are curved, flexible, rounded, and/or bendable. Thus, while for convenience the drawings depict flat or planar display layers, other implementations can be incorporated in a variety of display geometries and display types while remaining within the scope of this application.

In addition, for purposes of this description, TIR can be understood to occur when an electromagnetic wave (for example, light) propagating in a material or medium with a higher refractive index encounters a smooth interface with a lower refractive index material or medium, at an incidence angle greater than or equal to a critical angle (which depends on the relative refractive indices of the two materials). Thus, for angles of incidence greater than the critical angle, light undergoes total internal reflection. Additionally, partial internal reflection can occur at angles of incidence below the critical angle, with a first portion of the light being reflected at the material interface back into the material with the higher index of refraction, and a remaining portion of the light being transmitted into the material with the lower index of refraction. Since the material of the back layer 220 and the front layer 250 can have higher refractive indices than air, light that reaches the outer boundaries of the display at large incident angles undergoes internal reflection and travels along inside the display, instead of being able to escape (at least where the outer surfaces are smooth). In some cases, the reflected light is absorbed back into the light-emitting layers or electrodes.

However, where there are imperfections of, or contamination on, a surface of a display, light that might otherwise undergo internal reflection (including TIR) may escape the display and pass through a light receiving portion 232 of a light sensor 230 integrated behind the back layer 220 (such as a substrate layer) or other layers of the display. For some imaging light sensors, such as a camera arranged to record an image, ideally the light sensor would only sense light received via the light receiving portion 232 from surfaces and/or objects within a field of view (FOV) of the light sensor. In some cases, an FOV may also be understood to spatially represent an angular size of a view cone, or as an angle of view in one or more directions, where an angle of view is the angle of a subject area that is projected onto a light measurement device (for example, a CCD or CMOS imaging device including an array of pixel sensors) by an optical lens system. However, in practice, real-world imaging light sensors—in particular miniaturized imaging light sensors—are affected by light received at a light receiving portion along angles or from positions outside of an intended FOV. For example, light may enter a camera lens or other optical lens system at an oblique angle, and then be diffracted, reflected, and/or scattered by interior surfaces and/or features of the light sensor 230 and affect measurement of light performed by the light sensor 230. The effects may be diffuse, and consequently reduce a contrast, color accuracy, and/or other accuracy of an affected imaging light sensor. Thus, in such and other cases, the placement of a light sensor behind a display can be associated with increased optical crosstalk of light from light sources included in the display, such as light-emitting diodes, on the light receiving portion 232 of the light sensor 230, relative to systems in which light sensors are not positioned behind a display, such as along a bezel.

In order to address these types of problems, the following disclosure provides techniques and systems for improving optical isolation of a light sensor. The implementations described herein can include provisions for shielding the light receiving portion of a light sensor from optical crosstalk in a display system in which the light sensor module is integrated behind a display. Thus, in different implementations, features and provisions described herein can be readily applied to other display types, including LCD and LED-based technologies. It should be understood that the drawings are not necessarily to scale.

Figure 3:
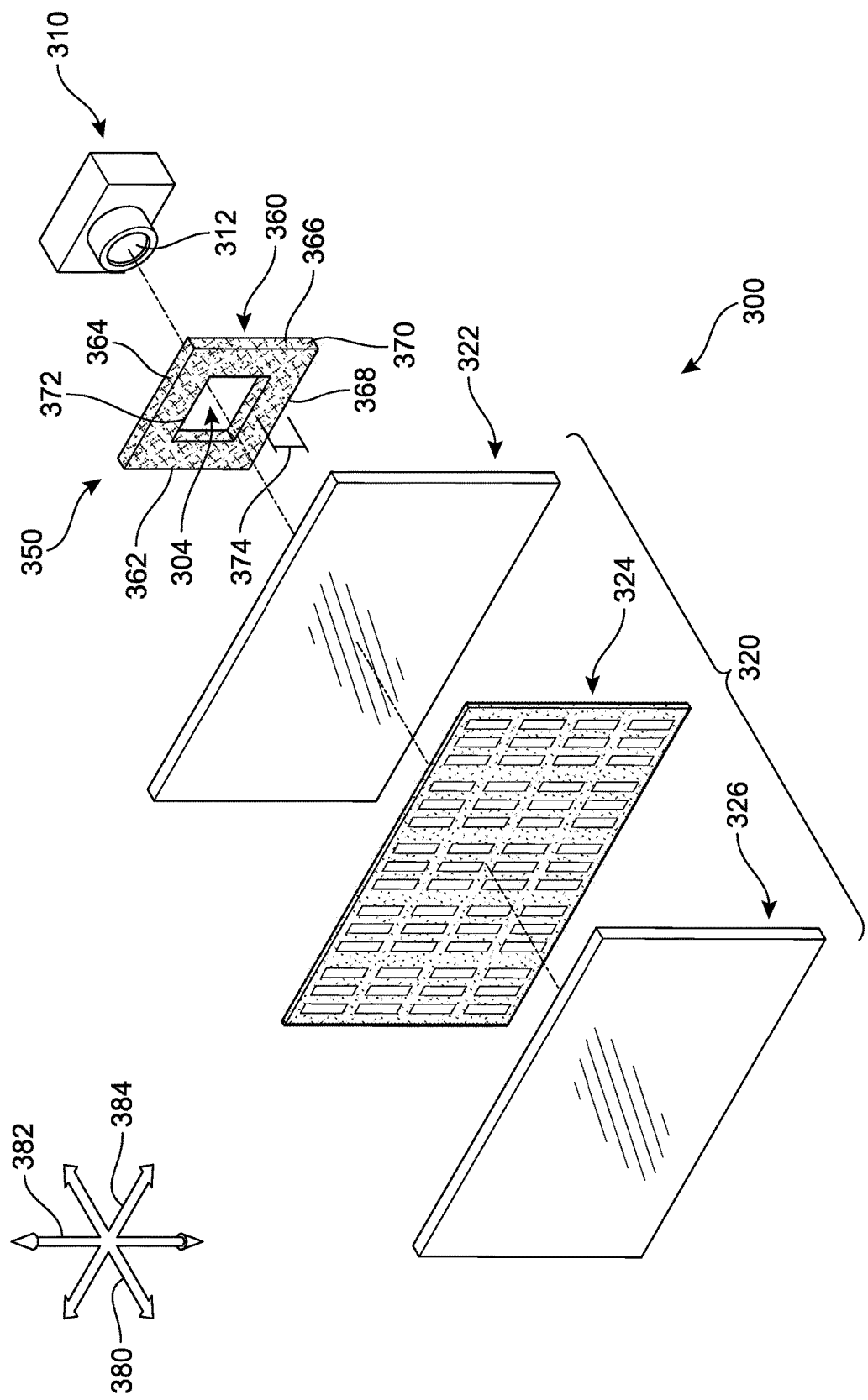
FIG. 3 is an exploded isometric view of an implementation of a first optical isolation system.
Figure 4:
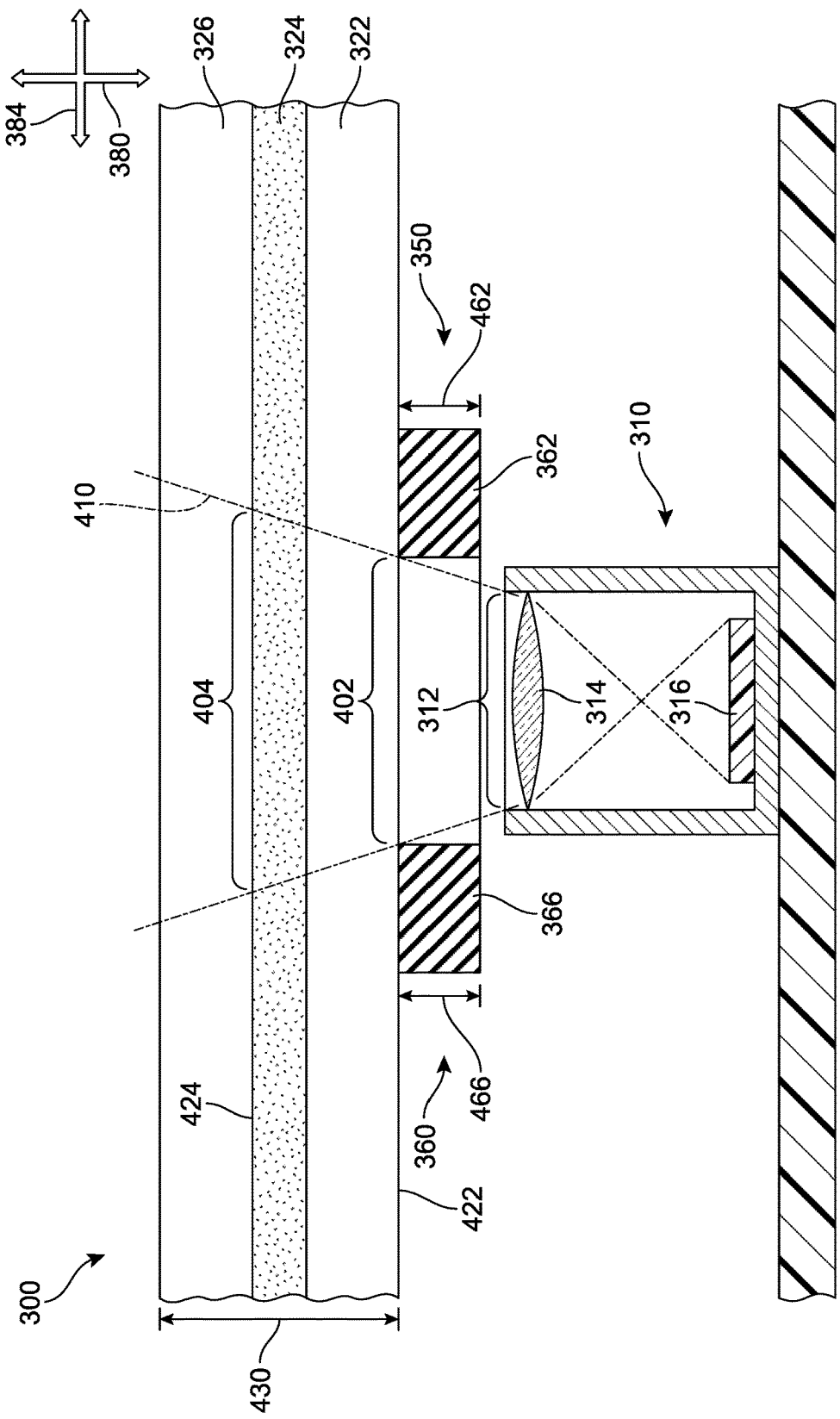
FIG. 4 is a cross-section view of an implementation of a portion of the system of FIG. 3.
Figure 5:
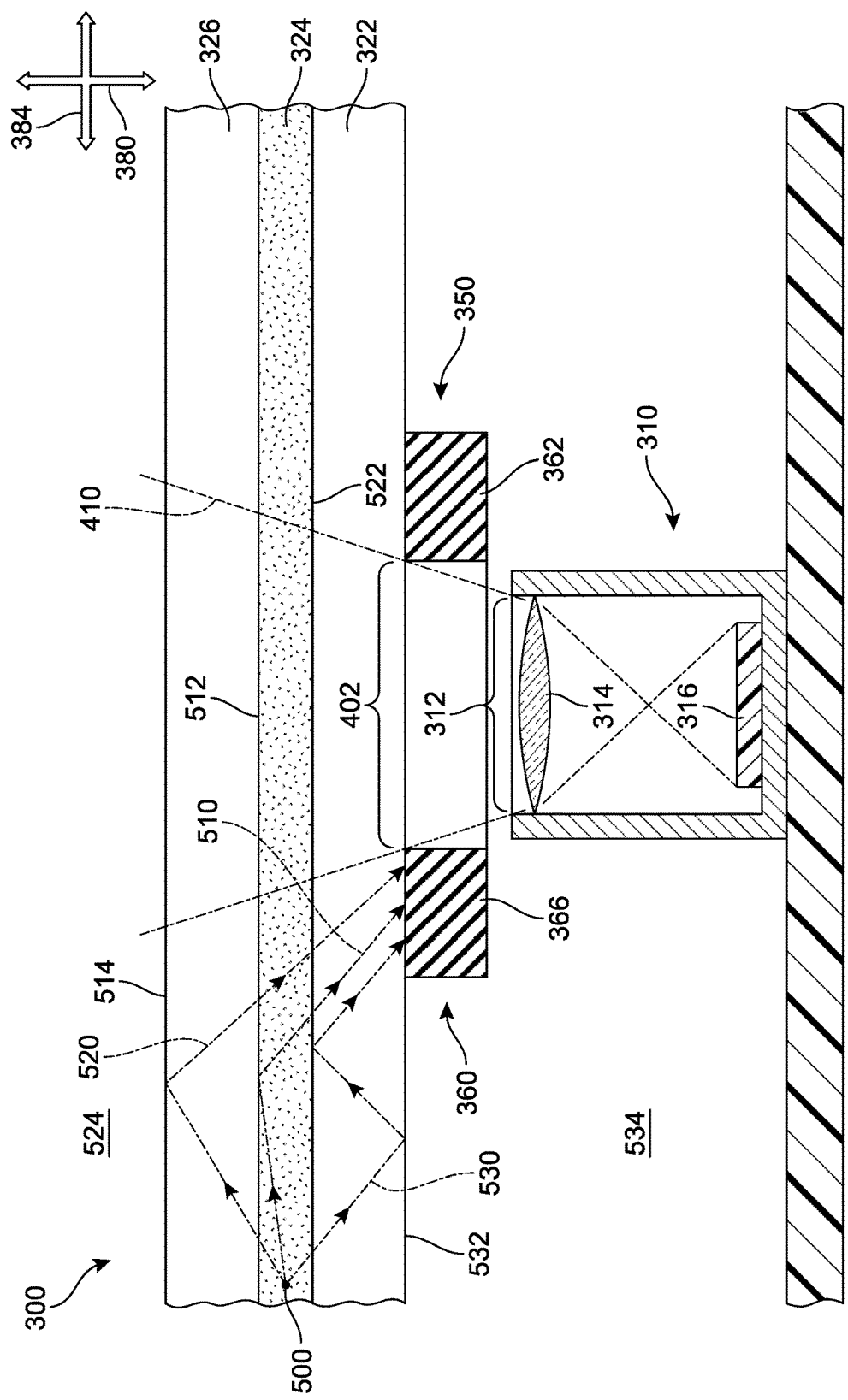
FIG. 5 is a cross-section view of an implementation of a portion of the system of FIG. 3.

Referring now to FIGS. 3-5, an implementation of a first display system 300 is depicted in which a light sensor, embodied as an RGB camera module ("RGB camera") 310, is positioned behind a rear surface of a display 320. It is noted that other types of light sensors may be used instead of RGB camera 310. In addition, the first display system 300 includes a first optical isolation system ("first system") 350. In this example, the display 320 is OLED-based. In different implementations, the first optical isolation system 350 is configured to reduce or prevent light emitted by the light-emitting layer 324 (or other display light sources) from impinging on a light receiving portion 312 of the RGB camera 310 (for example, an optical lens of the RGB camera 310). However, as noted above, the first display system 300 can be used with various other display types.

Generally, an OLED-based light-emitting layer 324 includes organic light-emitting diode elements disposed between and electrically connected to anodes and cathodes. In different implementations, an OLED-based light-emitting layer 324 may include, for example, an anode layer, a hole injection layer, a hole transport layer, an electron blocking layer, an emissive layer, a hole blocking layer, an electron transport layer, an electron injection layer, a protective layer, a cathode layer, and/or a barrier layer. These various layers may be formed on substrate layer 322. The properties and functions of these various layers, as well as example materials, are described in more detail in U.S. Pat. No. 7,279,704, filed Jan. 10, 2005, and entitled "Complexes with tridentate ligands", and U.S. Pat. No. 9,661,709, filed Mar. 26, 2015, and entitled "Integrated LED/OLED lighting system", both of which are incorporated by reference in their entirety.

In FIGS. 3-5, the RGB camera 310 is disposed behind a back layer 322, a light-emitting layer 324, and a front layer 326. In some implementations, the RGB camera 310 can be understood to be integrated or connected to other components, for example on a circuit board. For purposes of simplicity, the light-emitting layer 324 can be understood to include the light-emitting components for the display 320, as identified above. In addition, in some implementations, the front layer 326 includes a glass and/or polarizer. In some other implementations, the display 320 may not include a cover layer or front layer and the back layer can function as a substrate and/or cover for the display. In FIG. 3, an exploded isometric view of an implementation of a portion of the first display system 300 with the RGB camera 310 positioned behind display 320 is shown. It should be understood that the position of the various light sensors in the Figures are provided as examples only, and the light sensors can be disposed anywhere behind their respective displays and still be within the scope of this disclosure. In addition, the display 320 depicted in the following figures is shown as an example only, and other displays may include additional components or layers, or layers that have been depicted can be omitted, while still remaining within the scope of the disclosure.

As used herein, the term "above" refers to a direction toward an exterior front facing portion of the display (closest to a user when the user is viewing an image), and the term "below" refers to a direction toward the interior of the display. For example, where a first layer is described as "disposed over" a second layer, the first layer is disposed closer to the front layer than the second layer. There may be other layers between the layers and components described herein, unless it is specified that a layer or component is "in contact with" another layer or component. For example, a cathode may be described as "disposed over" an anode, even though there are various light-emitting layers in between.

In different implementations, the first optical isolation system 350 includes provisions for shielding or protecting the RGB camera 310 from optical crosstalk, and/or otherwise decreasing the effect of optical crosstalk on the light receiving portion 312 of the RGB camera 310. In the implementation presented in FIGS. 3-5, the first optical isolation system 350 includes a first gasket 360 that forms a border or frame around the region in which the RGB camera 310 is located. Thus, in one implementation, the first gasket 360 bounds or substantially surrounds an opening or aperture 304.

In different implementations, the gaskets described herein may be opaque to the wavelengths of light emitted by one or more light sources, and designed to block optical crosstalk from other portions of the display from reaching a light receiving portion of a light sensor. Thus, in some implementations, the material of the gasket is configured to absorb and/or block light from the one or more light sources reflecting through and along various layers of the display which would otherwise reach the light receiving portion and affect measurements performed by the light sensor. In one implementation, the gasket includes a material with a higher index of refraction than an adjacent display layer, such as, but not limited to, a foam. The gasket can be attached or adhered to a surface of a display layer using any adhesives typically used in computer devices and electronics. For example, the gasket may be joined to the back layer with a pressure sensitive adhesive (PSA).

In different implementations, the geometry and/or dimensions of the first gasket 360 may be configured to provide varying degrees of optical isolation for the RGB camera 310, and/or may be optimized to correspond to the placement, type, FOV, and/or size of the RGB camera 310, as well as the type, thickness, construction, and/or size of the display 320. In some implementations, the first gasket 360 may have a square, rectangular, parallelogram-like, trapezoid-like, or an otherwise oblong shape. For example, in FIG. 3, the first gasket 360 includes a generally rectangular shape formed by four substantially elongated segments or edges, including a first segment 362, a second segment 364, a third segment 366, and a fourth segment 368. For purposes of this disclosure, an elongated segment is associated with a shape that includes a substantially larger length than width. However, in other embodiments, the first gasket 360 may be arranged in any regular or irregular shape, such as a circle, ellipse, oval, triangle, pentagon, or any other regular or irregular shape. Furthermore, the perimeter of the first gasket 360 may include linear sides, curved sides, undulating sides, or other regular or irregular edges, for example. In addition, in different implementations, the thickness of the first gasket 360 can be substantially uniform or consistent throughout its structure, or there may be variations in the thickness. As an example, in different implementations, a gasket segment may include a cross-sectional triangular shape in a vertical plane, or a square, rectangular, trapezoidal, curved, circular, elliptical, or other regular or irregular cross-sectional shape along a vertical plane. By varying the thickness and/or shape, the first gasket 360 may better mate with other structures included in the first display system 300.

In different implementations, the dimensions of the first gasket 360 may also vary. For example, an inner perimeter 372 of the first gasket 360 may be configured to have a size substantially equal to or greater than a size, such as a diameter or width, of the light receiving portion 312. In one implementation, the first gasket 360 has dimensions that substantially correspond to the outer edges of the light receiving portion 312, thereby providing an inner perimeter 372 that extends around and slightly larger than the light receiving portion 312. In one implementation, the first gasket 360 is configured with a size and shape such that the dimensions of the light receiving portion 312 and/or an exterior of the RGB camera 310 (such as, but not limited to, a lens barrel or housing) and the inner perimeter 372 of the gasket 360 generally correspond or align with one another.

Furthermore, in some implementations, a width 374 of the first gasket 360 can vary. The width 374 can be understood to refer to a distance between an outer perimeter 370, associated with an outer periphery of the first gasket 360, and an inner perimeter 372, where the inner perimeter 372 defines the shape and size of the aperture 304. For example, in some implementations, a width of at least a portion the first gasket 360 can be configured to optimize the reduction of optical crosstalk reaching the light receiving portion 312.

For purposes of clarity, FIG. 3 is presented with reference to a vertical axis 380, a longitudinal axis 382, and a lateral axis 384. Referring to the exploded view of FIG. 3, it can be seen that first segment 362 and third segment 366 are substantially aligned with the longitudinal axis 382, and second segment 364 and fourth segment 368 are substantially aligned with the lateral axis 384. However, it should be understood that the number and/or orientation of each of the segments, the geometry, and the dimensions can vary in other implementations, for example to optimize the placement of the first gasket 360 among other components of the first display system 300 adjacent to the RGB camera 310. An optical axis of the RGB camera 310 may be substantially aligned with the vertical axis 380.

In FIG. 4, a schematic cross-section of a portion of the first display system 300 is illustrated. For purposes of clarity, FIG. 4 is presented with reference to lateral axis 384 and vertical axis 380. The RGB camera 310 is disposed below the back layer 322. In some implementations, the RGB camera 310 is disposed at least in part below the first gasket 360. In addition, in this example, the first gasket 360 is disposed beneath back layer 322, and the light-emitting layer 324 is disposed above the back layer 322 and beneath the front layer 326. In one implementation, the light-emitting layer 324 is mounted in close proximity to the front layer. Furthermore, in some implementations, at least a portion of the RGB camera 310 can be in intimate contact with or close proximity to the back layer 322, which may position the light receiving portion 312 in intimate contact or close proximity to the back layer 322. For example, in some cases, portions of the RGB camera 310 can touch a lower side or lower surface 422 of the back layer 322 or other rearmost layer of the display 320. Similarly, in some implementations, portions of the front layer 326 can touch the upper side 424 of the light-emitting layer 324. However, in other implementations, there may be no contact between the RGB camera 310 and the back layer 322.

In FIG. 4, a general representation of an FOV 410 of the RGB camera 310 is depicted by dashed lines extending upward. The FOV 410 can vary in different implementations, depending on a camera or other light sensor module that is selected for use in the display system 300. It should be understood that the FOV 410 is shown as an example only, and in some implementations may correspond to only a portion of angles via which light rays may impinge on light receiving portion 312 and affect measurements performed by the RGB camera 310. Where the FOV 410 intersects with the lower surface 422 of the back layer 322 is an area or first zone 402 along the lower surface 422 that is adjacent to or directly across from the light receiving portion 312. The first zone 402 can be generally aligned with or face the opening of the aperture 304 defined by the first gasket 360 in some implementations. Similarly, a second zone 404 may be identified for the light-emitting layer 324 based on the FOV 410, where light sources such as OLED subpixels or pixels and related structures within the second zone 404 are also within the FOV 410. This second zone 404 can have different sizes to best accommodate the operation of the integrated RGB camera 310 positioned behind various layers of the display 320 (for example, the light-emitting layer 324) that may more directly affect images captured by the RGB camera 310 (for example, light emitted by light sources in the light-emitting layer 324 and/or diffraction caused by structures in light-emitting layer 324. The composition or arrangement of these layers will depend on the thin film display technology or other image-producing technology that is used in conjunction with the following implementations. In some implementations, these layers include a thin film transistor or active matrix transistor for control of pixel cells including on/off control, a color filter or color light transmitting component depending on technology, and various structural and light conditioning layers. In some examples, there is a backlight layer (for example, for a LCD device) adapted to emit light in a forward direction through front layer 326, and also allow light to suitably pass through for a light sensor, such as the RGB camera 310, positioned behind the backlight layer.

Referring again to FIG. 4, portions of the first segment 362 and the third segment 366 of the first gasket 360 are also shown, arranged on opposite sides of the RGB camera 310. The first segment 362 has a first thickness 462 and the third segment 366 has a second thickness 466. In some implementations, the first thickness 462 and the second thickness 466 can be substantially similar, as depicted in FIG. 4, while in other implementations, the thicknesses can differ. In addition, as noted earlier, the thickness can vary through the width of a segment, such that first thickness 462 varies across its width. In some implementations, a thickness of the first gasket 360 (for example, first thickness 462 or second thickness 466) can be between 1-40 times greater than the thickness of the combined light-emitting layer 324 and back layer 322, or a total thickness 430 of the display 320 (or at least those layers which may be involved in waveguiding), though in other implementations, the thickness ratio may be greater. In one implementation, the thickness of the gasket is at least 1.5 greater than the thickness of the layers of the OLED display.

Referring now to FIG. 5, an example of the optical disruption provided by the first optical isolation system 350 is illustrated. FIG. 5 is presented simply as a representation, and the lines representing the paths of light rays 510, 520, and 530 are for purposes of example only. Furthermore, though only three examples of light rays and internal reflection are provided, it should be understood that there may be other interfaces and surfaces by which light can be rerouted. In FIG. 5, dashed lines representing a first light ray 510, a second light ray 520, and a third light ray 530 are shown. Each of the light rays 510, 520, and 530 can be understood to emanate from a light source 500 within the display 320. For example, the light source 500 may be an LED associated with a pixel or subpixel element of an OLED-based light-emitting layer 324. The light source 500 can emit light in multiple directions, only three of which are shown here for purposes of simplicity. Light emitted by the light source 500 might escape through the front layer 326 (and possibly viewed by a user), or it may be absorbed by other internal components and/or mechanical assembly of the display. Additionally, as described above with respect to FIG. 2 and illustrated by light rays 510, 520, and 530, some light may reflect off of various material interfaces associated with the display 320 or be dispersed due to diffraction by, or secondary reflections from, the mechanical assembly.

As a first example, the first light ray 510 is shown moving at an upward angle until it strikes a first interface 512, here an interface between the light-emitting layer 324 and the front layer 326. The first light ray 510 then reflects (or "bounces") back and moves in a downward direction. In the absence of the first gasket 360 the first light ray 510 (or a portion of its light) would impinge on the light receiving portion 312 of the RGB camera 310 and degrade measurements performed by the RGB camera 310. However, in this case the first light ray 510 is outcoupled from the back layer 322 and absorbed by the first gasket 360, thereby isolating the RGB camera 310 from the effects of optical crosstalk that would have been associated with the first light ray 510 or other such light rays.

Similarly, in a second example, the second light ray 520 is shown moving at an upward angle until it strikes a second interface 514, here an interface between the front layer 326 and an outside environment 524 (which is typically air having a lower index of refraction). The second light ray 520 then reflects back and moves in a downward direction. In the absence of the first gasket 360 the second light ray 520 would impinge on the light receiving portion 312 of the RGB camera 310 and affect measurements performed by the RGB camera 310. However, in this case the second light ray 520 is outcoupled from the back layer 322 and absorbed by the first gasket 360, thereby isolating the RGB camera 310 from the effects of optical crosstalk that would have been associated with the second light ray 520 or other such light rays.

As a third example, the third light ray 530 is shown moving at a downward angle until it strikes a third interface 532, here an interface between the back layer 322 and an internal environment 534 (for example, air). The third light ray 530 then reflects back and moves in an upward direction. In the absence of the first gasket 360 the third light ray 530 would, after additional reflections within, and transmission along, the layers of the display 320, impinge on the light receiving portion 312 of the RGB camera 310. However, in this case the third light ray 530 is outcoupled from the back layer 322 and absorbed by the first gasket 360, thereby isolating the RGB camera 310 from the effects of optical crosstalk that would have been associated with the third light ray 530 or other such light rays.

In other implementations, the optical isolation systems and methods described herein can be configured to reduce optical crosstalk for a variety of other light sensor arrangements, including for various or mixed types of light sensors. For example, some implementations can include provisions for shielding an IR camera from optical crosstalk in displays in which the IR camera is integrated behind a display, even if the display emits little or no IR light. In different implementations, optical isolation systems are configured to reduce or prevent light emitted by a light-emitting layer (or other display light sources) from impinging on a light receiving portion of an IR camera, such as an IR camera lens. This is useful and effective in reducing amounts of light of undesired wavelengths (for example, visible light emitted by the light-emitting layer) that might otherwise pass through bandpass filtering and affect measurements. This offers a mechanism to reduce sensitivity of the IR camera to RGB display light, thus allowing the IR camera to operate concurrently with the display. Further, this is useful and effective in reducing amounts of light of desired wavelengths (for example, IR light, including IR light emitted by the light-emitting layer) that are received via waveguiding through the display and affect measurements. In addition, in implementations that also include an RGB camera or other non-IR type of light sensor, optical isolation systems may reduce crosstalk between an IR light source, used to provide illumination for the IR camera, and the RGB camera. This is useful and effective in reducing amounts of light of undesired wavelengths that might otherwise pass through bandpass filtering and affect measurements.

Figure 6:
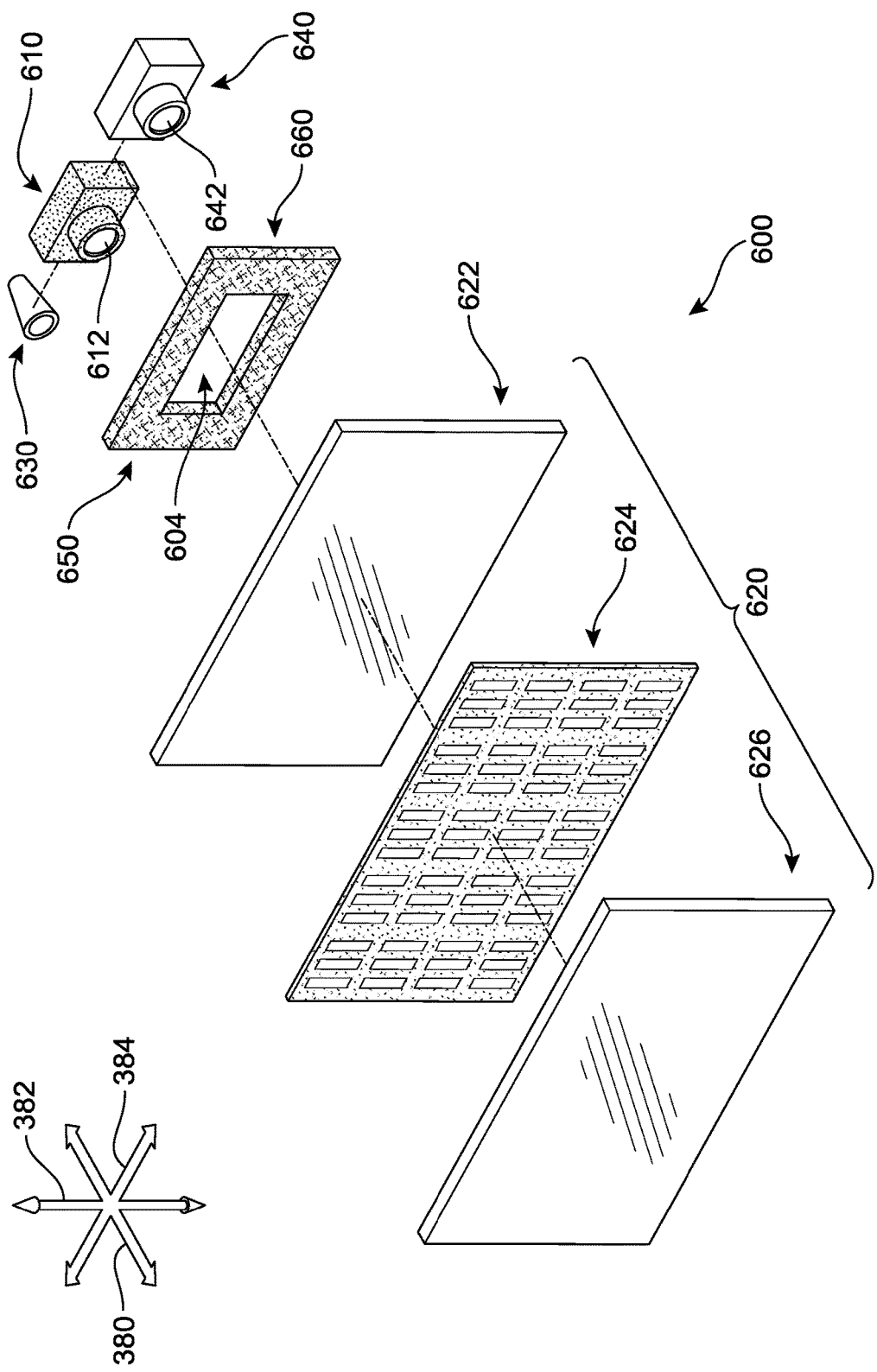
FIG. 6 is an exploded isometric view of an implementation of a second optical isolation system that includes an infrared camera.
Figure 7:
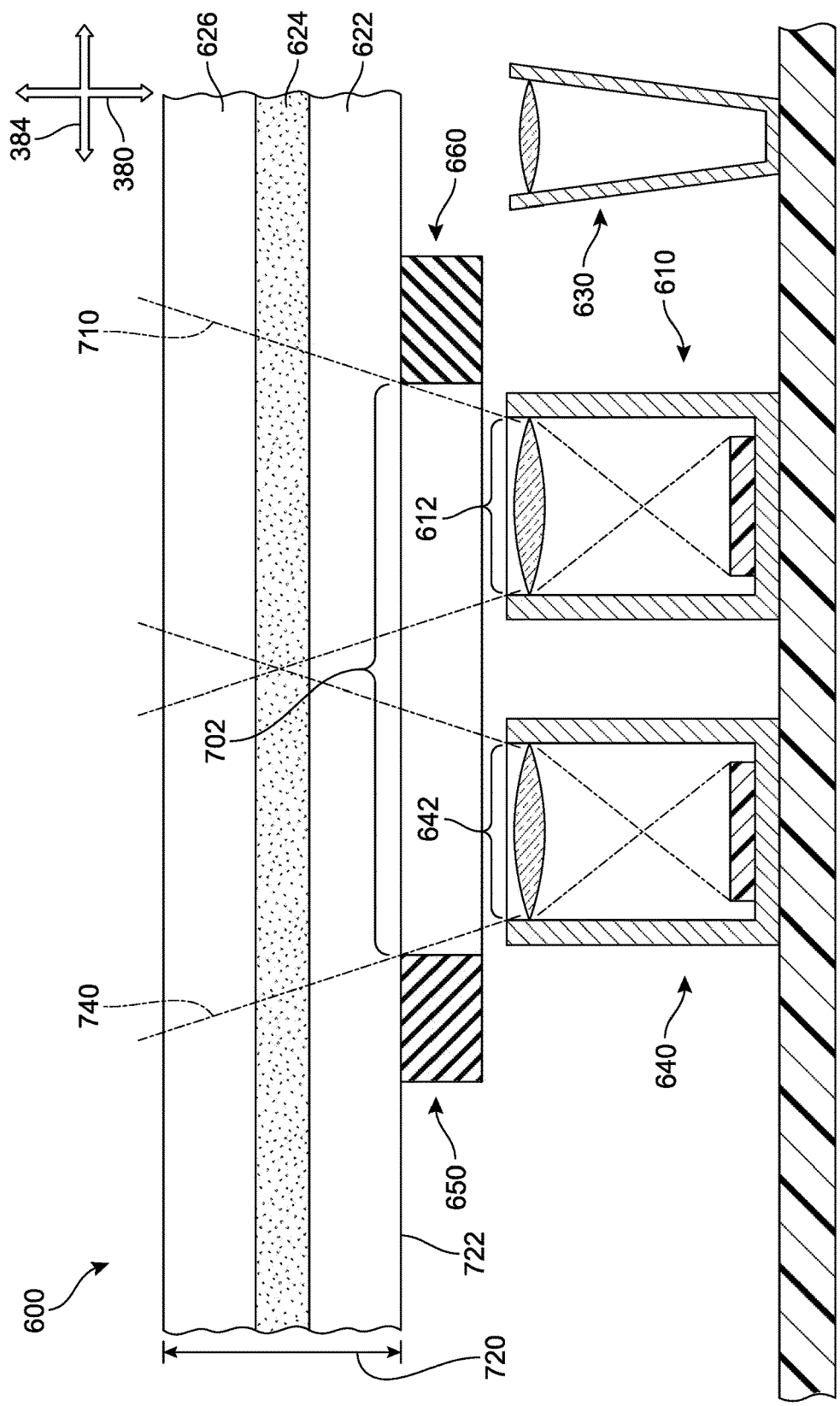
FIG. 7 is a cross-section view of an implementation of a portion of the system of FIG. 6.
Figure 8:
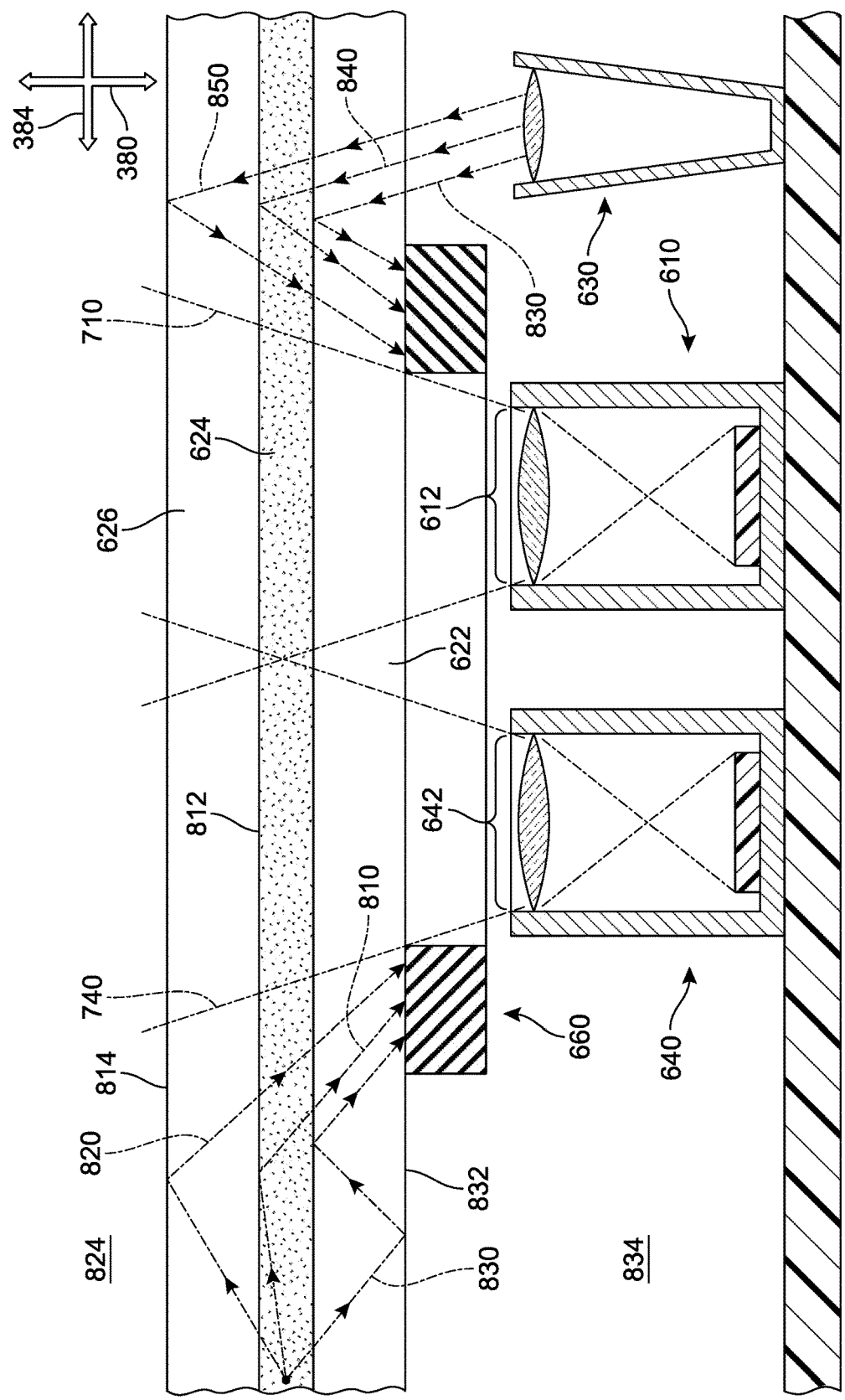
FIG. 8 is a cross-section view of an implementation of a portion of the system of FIG. 6.

Referring now to FIGS. 6-8, an implementation of a second display system 600 is depicted in which a light sensor embodied as an IR camera module ("IR camera") 610 is disposed behind a display 620. The second display system 600 further includes an infrared light source ("IR source") 630 used to provide illumination of a scene for the IR camera 610. In addition, the second display 600 includes a second optical isolation system ("second system") 650. In this example, the display 620 is also OLED-based, with light being emitted by light-emitting layer 624, although other types of displays may be used as discussed previously. However, as noted earlier, it should be understood that in other implementations, features and provisions described herein can be readily applied to other display types, including, but not limited to, LCD- and LED-based technologies. Furthermore, it should be understood that the drawings are not necessarily to scale.

In FIGS. 6-8, the IR camera 610 and IR source 630 are disposed behind a back layer 622, a light-emitting layer 624, and a front layer 626. In some implementations, the IR camera 610 can be understood to be integrated or connected to other components, for example along with IR camera 610 and/or RGB camera 640 on a circuit board. In FIG. 6, an exploded isometric view of an implementation of a portion of the second display system 600 with the IR camera 610 and IR source 630, as well as a light sensor embodied as an RGB camera 640, are shown.

In some other implementations, rather than using discrete RGB and IR cameras as illustrated in FIGS. 6-8, a single camera such as a hybrid, hyperspectral, or multispectral camera can be configured to capture both RGB and IR image data. Thus, while two cameras are shown in FIGS. 6-8, it should be understood that a single camera may provide similar functionality. For example, the camera can include some elements that are responsive to RGB wavelengths as well as elements that are responsive to IR wavelengths. It is further noted that the positions of the light sensors in the Figures are provided as examples only, and the light sensors can be disposed anywhere else behind the displays and still be within the scope of the following description.

Referring to FIGS. 6-8, in different implementations, the second optical isolation system 650 includes provisions for shielding or protecting the IR camera 610 and RGB camera 640 from optical crosstalk, and/or otherwise decreasing the effect of optical crosstalk on the light receiving portions 612 and 642 of the cameras 610 and 640, respectively. In the implementation presented in FIGS. 6-8, the second optical isolation system 650 includes a second gasket 660 that forms a border or frame around a region of the display 620 behind which both the IR camera 610 and the RGB camera 640 are located. Thus, in one implementation, the second gasket 660 bounds or substantially surrounds an opening or aperture 604, and defines aperture 604. For purposes of clarity, FIG. 6 is presented with reference to vertical axis 380, longitudinal axis 382, and lateral axis 384, much as in FIG. 4.

In different implementations, the geometry and/or dimensions of the second gasket 660 may be configured to provide varying degrees of optical isolation for the IR camera 610 and/or the RGB camera 640, and/or may be optimized to correspond to the placement, type, FOV, and/or size of the two cameras. In some implementations, the second gasket 660 may have a square, rectangular, parallelogram-like, trapezoid-like, or an otherwise oblong shape. For example, in FIG. 6, the second gasket 660 includes a generally rectangular shape formed by four substantially elongated segments or edges. However, in other embodiments, the second gasket 660 may include any regular or irregular shape, such as a circle, ellipse, oval, triangle, pentagon, or any other regular or irregular shape. Furthermore, the perimeter of the second gasket 660 may include linear sides, curved sides, undulating sides, or other regular or irregular edges, for example. In addition, in different implementations, the thickness of the second gasket 660 can be substantially uniform or consistent throughout its structure, or there may be variations in the thickness. As an example, in different implementations, a gasket segment may include a cross-sectional triangular shape in a vertical plane, or a square, rectangular, trapezoidal, curved, circular, elliptical, or other regular or irregular cross-sectional shape along a vertical plane.

In different implementations, the dimensions of the second gasket 660 may also vary. For example, the gasket dimensions may be configured to correspond to a size substantially equal to or greater than the light capture region for both the IR camera 610 and the RGB camera 640. In one implementation, the gasket border has dimensions that substantially correspond to the outermost edges of the light capture region for both cameras, thereby providing a perimeter that is just large enough to provide maximum optical isolation. In one implementation, the second gasket 660 is configured with a size and shape such that the dimensions of the two light capture regions and the inner perimeter of the gasket generally correspond or align with one another.

In FIG. 7, a schematic cross-section of a portion of the second display 600 is illustrated. For purposes of clarity, FIG. 7 is presented with reference to lateral axis 384 and vertical axis 380. In some implementations, the IR camera 610, the RGB camera 640, and the IR source 630 are disposed below the back layer 622, and at least in part below the second gasket 660. However, in other implementations, one or more of these components may be positioned elsewhere relative to the other layers of the display. In this case, the second gasket 660 is disposed beneath the back layer 622, and the light-emitting layer 624 is disposed above the back layer 622 and beneath the front layer 626. In one implementation, the light-emitting layer 624 is mounted in close proximity to the front layer. Furthermore, in some implementations, at least a portion of the IR camera 610 and/or RGB camera 640 can be in intimate contact or close proximity to the back layer 622. For example, in some cases, portions of the IR camera 610 can touch a lower side or lower surface 722 of the back layer 622 or other display layer. However, in other implementations, there may be no contact between the cameras and the back layer or light-emitting layer.

In FIG. 7, a first FOV 710 of the IR camera 610 is depicted by dashed lines extending upward, and a second FOV 740 of the RGB camera 640 is depicted by a second set of dashed lines extending upward. The light capture regions can vary in different implementations, depending on the specific camera modules that are selected for use in the display. In addition, in FIG. 7, the lower surface 722 includes a second zone 702 that is adjacent to or directly across from the light receiving portions 612 and 642. It can be understood that the second zone 702 encompasses at least the portions of the lower surface 722 where the first FOV 710 and the second FOV 740 intersect with the lower surface 722. Furthermore, in some implementations, the second zone 702 can be generally aligned with or face the opening of the aperture 604 defined by the second gasket 660. Portions of the second gasket 660 are also shown, arranged on opposite sides of the light sensor set (or camera set), where, in FIG. 7, the term "light sensor set" refers to the set including the IR camera 610 and the RGB camera 640.

Referring now to FIG. 8, an example of the reduction in optical crosstalk provided by the second optical isolation system 650 is illustrated. FIG. 8 is presented simply as a representation, and the lines representing the paths of light are for purposes of example only. Furthermore, though only six examples of light rays and internal reflection are provided, it should be understood that there may be other interfaces and surfaces by which light can be routed. In FIG. 8, lines representing a first light ray 810, a second light ray 820, a third light ray 830, a fourth light ray 840, a fifth light ray 850, and a sixth light ray 860 are shown. Each of the light rays 810, 820, and 830 can be understood to emanate from a light source within the display 620. For example, the first light ray 810, the second light ray 820, and the third light ray 830 are emanating from a common light source included in the light-emitting layer 624. In some implementations, the light source can emit light in multiple directions, only three of which are shown here for purposes of simplicity. In addition, the fourth light ray 840, the fifth light ray 850, and the sixth light ray 860 are being emitted from the IR source 630. It should be understood that while IR source 630 can emit IR light in multiple directions, only three are shown here for purposes of simplicity. As the light travels away from either the light source included in the light-emitting layer 624 or the IR source 630, it can reach a user through the front layer 626, or it may be absorbed by other internal components and/or mechanical assembly of the display system 600. However, as described above with respect to FIG. 2, some light may reflect off of various material interfaces and structures associated with the display 620 as a result of internal reflection (partial and total internal reflections) or secondary reflections from the mechanical assembly.

As a first example, the first light ray 810 is shown moving at an upward angle until it strikes a first interface 812, here an interface between the light-emitting layer 624 and the front layer 626. The first light ray 810 then reflects (or "bounces") back and moves in a downward direction. In the absence of the second gasket 660 the first light ray 810 might reach the light receiving portion 642 of RGB camera 640 and/or the light receiving portion 612 of the IR camera 610. However, in this case the first light ray 810 is absorbed by the second gasket 660, thereby isolating the IR camera 610 and the RGB camera 640 from the effects of optical crosstalk that would have been associated with the first light ray 810.

Similarly, in a second example, the second light ray 820 is shown moving at an upward angle until it strikes a second interface 814, here an interface between the front layer 626 and an outside environment 824 (which is typically air having a lower index of refraction). The second light ray 820 then reflects back and moves in a downward direction. In the absence of the second gasket 660 the second light ray 820 might reach the light receiving portion 642 of RGB camera 640 and/or the light receiving portion 612 of the IR camera 610. However, in this case the second light ray 820 is absorbed by the second gasket 660, thereby isolating the IR camera 610 and the RGB camera 640 from the effects of optical crosstalk that would have been associated with the second light ray 820.

As a third example, the third light ray 830 is shown moving at a downward angle until it strikes a third interface 832, here an interface between the back layer 622 and an internal environment 834 (for example, air). The third light ray 830 then reflects back and moves in an upward direction. In the absence of the second gasket 660 the third light ray 830 might reach the light receiving portion 642 of RGB camera 640 and/or the light receiving portion 612 of the IR camera 610. However, in this case the third light ray 830 is absorbed by the second gasket 660, thereby isolating the IR camera 610 and the RGB camera 640 from the effects of optical crosstalk that would have been associated with the third light ray 830.

In addition to light sources included in the display 620, such as, but not limited to, LEDs or a backlight, the optical isolation system 650 can also offer protection from optical crosstalk originating from other light sources in the display system 600. In FIG. 8, it can be seen that three infrared light rays including the fourth light ray 840, the fifth light ray 850, and the sixth light ray 860 are being waveguided through and along the display 620, reflecting along through various layers of the display 620. In some implementations, the gasket 660 may be configured to help provide optical isolation from IR source 630.

For example, the fourth light ray 840 is shown moving at an upward angle until it strikes the first interface 812. The fourth light ray 840 then reflects back and moves in a downward direction. In the absence of the second gasket 660 the fourth light ray 840 might reach the light receiving portion 642 of RGB camera 640 and/or the light receiving portion 612 of the IR camera 610. However, in this case the fourth light ray 840 is absorbed by the second gasket 660, thereby isolating the IR camera 610 and the RGB camera 640 from the effects of optical crosstalk that would have been associated with the fourth light ray 840.

Similarly, in another example, the fifth light ray 850 is shown moving at an upward angle until it strikes the second interface 814. The fifth light ray 850 then reflects back and moves in a downward direction. In the absence of the second gasket 660 the fifth light ray 850 might reach the light receiving portion 642 of RGB camera 640 and/or the light receiving portion 612 of the IR camera 610. However, in this case the fifth light ray 850 is absorbed by the second gasket 660, thereby isolating the IR camera 610 and the RGB camera 640 from the effects of optical crosstalk that would have been associated with the fifth light ray 850.

Similarly, the sixth light ray 860 is shown moving at a downward angle until it strikes the third interface 832. The sixth light ray 860 then reflects back and moves in an upward direction. In the absence of the second gasket 660 the sixth light ray 860 might reach the light receiving portion 642 of RGB camera 640 and/or the light receiving portion 612 of the IR camera 610. However, in this case the sixth light ray 860 is absorbed by the second gasket 660, thereby isolating the IR camera 610 and the RGB camera 640 from the effects of optical crosstalk that would have been associated with the sixth light ray 860.

In different implementations, display systems described herein can alternatively or additionally include one or more other features for reducing optical crosstalk reaching a light sensor. In some implementations, a lower surface of one of the display layers—here, the lower surface of a back layer that faces toward the light sensor(s)—can include various types of optical disrupting features. For example, the lower surface may include an optical disrupting region including a pattern of grooves, slots, undulations, hatching, texturing, cuts, openings, and/or other non-smooth, rough, jagged, irregular, or otherwise uneven surface portions. These features can be associated with variations in the thickness of the display. In one implementation, the optical disrupting region forms a pattern that can be associated with geometric shapes such as a square, rectangular, parallelogram-like, trapezoid-like, or an otherwise oblong shape across the surface. For example, referring briefly to FIG. 12, though only a cross-section is presented, in some implementations the grooves can be understood to extend in a substantially continuous manner around a portion of the lower surface. In other implementations, the patterns can be associated with any regular or irregular shape, such as a circle, ellipse, oval, triangle, pentagon, or any other regular or irregular shape. Furthermore, the edges of a pattern may include linear sides, curved sides, undulating sides, or other regular or irregular edges, for example. Surfaces that include such uneven regions can be understood to provide optical disrupting properties that can help scatter, absorb, or otherwise outcouple light waveguided by the display from reaching and affecting a light sensor. These implementations are described with reference to FIGS. 9-13. It should be understood that these drawings are not necessarily to scale.

Figure 9:
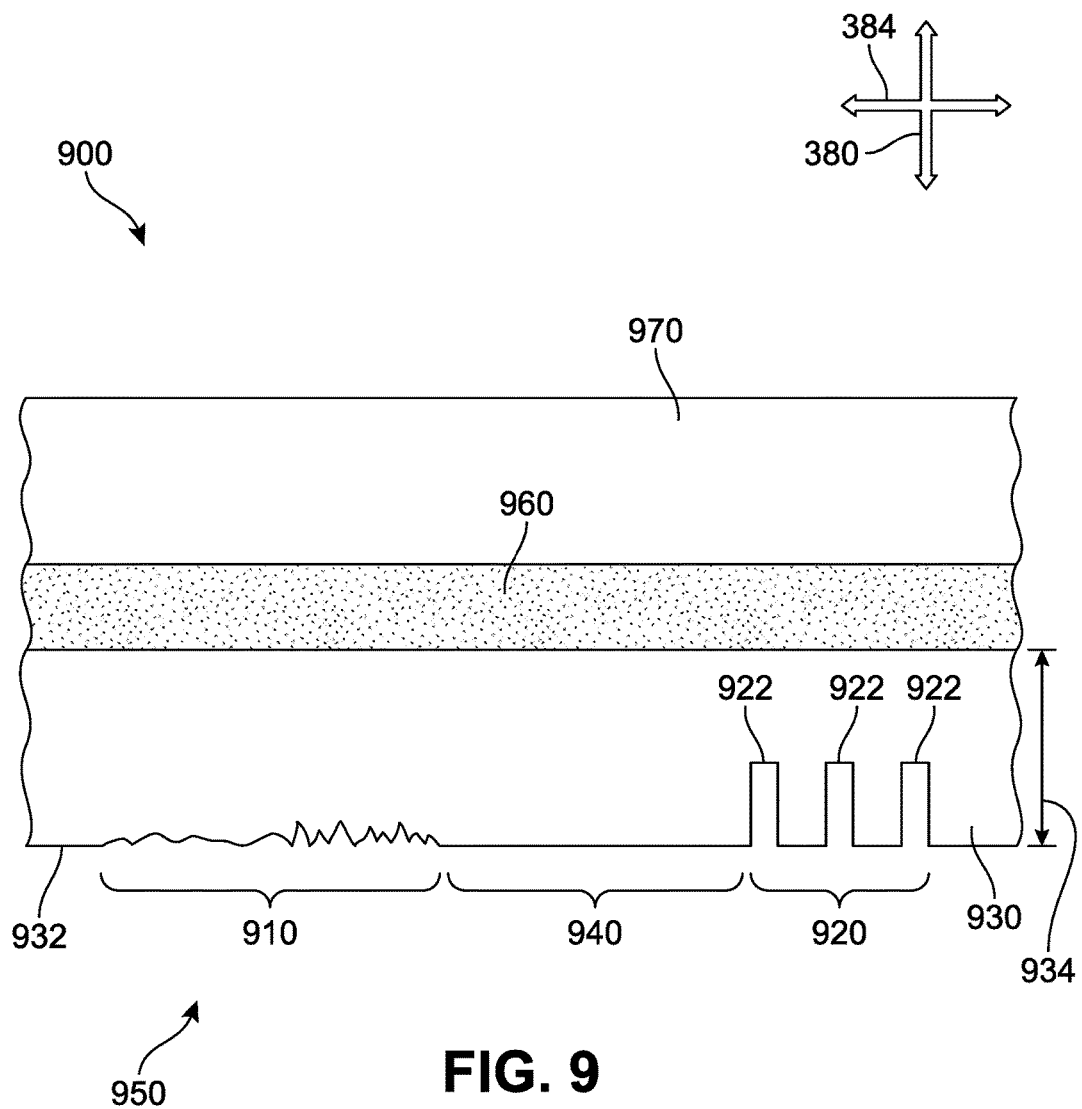
FIG. 9 is a cross-section view of an implementation of a portion of a third optical isolation system.

Referring first to FIG. 9, a schematic cross-section of an implementation of a portion of a third display 900 with a third optical isolation system ("third system") 950 is presented. The third display 900 includes a first optical disrupting region 910 and a second optical disrupting region 920. For purpose of this description, an optical disrupting region refers to a region of a display that includes features for disrupting waveguided light or other types of optical crosstalk from reaching a light sensor. For example, the optical disrupting region may include features which scatter the light through mechanical features in or on the back layer or other layer that is more proximate to the camera relative to other display layers. Such features can be further configured to outcouple the light through anti-guiding by the use of high index materials, for example. In other implementations, the features can be configured to absorb the light with optically absorbing materials. In some implementations, the optical disrupting features may include grooves 922 or abrasions and/or an optically opaque material within the grooves/abrasions or on a surface of the back layer 930.

In FIG. 9, the first disrupting region 910 and the second disrupting region 920 are each formed along or disposed on a lower surface 932 of a back layer 930. The back layer 930 is disposed below a light-emitting layer 960, and the light-emitting layer 960 is disposed beneath a front layer 970. The first disrupting region 910 includes an abraded or roughened texturing, providing optical disrupting features as described above. In some implementations, the first disrupting region 910 can encircle, substantially surround, or otherwise bound an area of the back layer 930 that is aligned with a light receiving portion of a light sensor or otherwise aligned with a light sensor. Here, for purposes of clarity, an example of an area 940 is identified which can be understood to correspond to the portion of the lower surface 932 that would be generally adjacent to a light receiving portion or light sensor. These patterns can be configured to disrupt internal reflection of waveguided light along the display 900 and/or prevent or reduce the amount of waveguided light that reaches a light receiving portion of a light sensor.

As another example, second disrupting region 920 includes a plurality of grooves 922 configured to serve as optical disrupting features as described above. In some implementations, the second disrupting region 920 can encircle, substantially surround, or otherwise bound the area 940 of the back layer 930 that is aligned with a light sensor. In implementations where the groove(s) 922 surround an image sensor zone or area, a groove 922 can be formed in the back layer to extend around the area 940 in a substantially continuously manner. In this case, one or more grooves 922 have been formed partially through the thickness 934 of the back layer 930, though in other implementations, the grooves 922 can be added on an extra layer or coating disposed on the lower surface 932. The grooves can be configured to disrupt the internal reflection of waveguided light within the display and/or prevent or reduce the amount of waveguided light that enters a camera. The cross-section of FIG. 9 shows three grooves 922. However, it should be understood that there may be one, two or greater than three grooves 922 in other implementations.

In different implementations, the grooves 922 may be formed to a depth of 25 microns (μm) to 300 μm, and further for example 200 μm, through the thickness of the back layer. In other implementations, the depth of the grooves 922 may be less than 25 μm or greater than 300 μm. In some other implementations, the grooves 922 can have a depth extending between 1% (blind-hole grooves) and 100% (through-hole grooves) of the back layer thickness 934. Furthermore, in some implementations, the grooves 922 may have a width, transverse to their depth, of 200 μm to 500 μm, though in other implementations the width of the grooves 922 may be less than 200 μm or greater than 500 μm.

Figure 10:
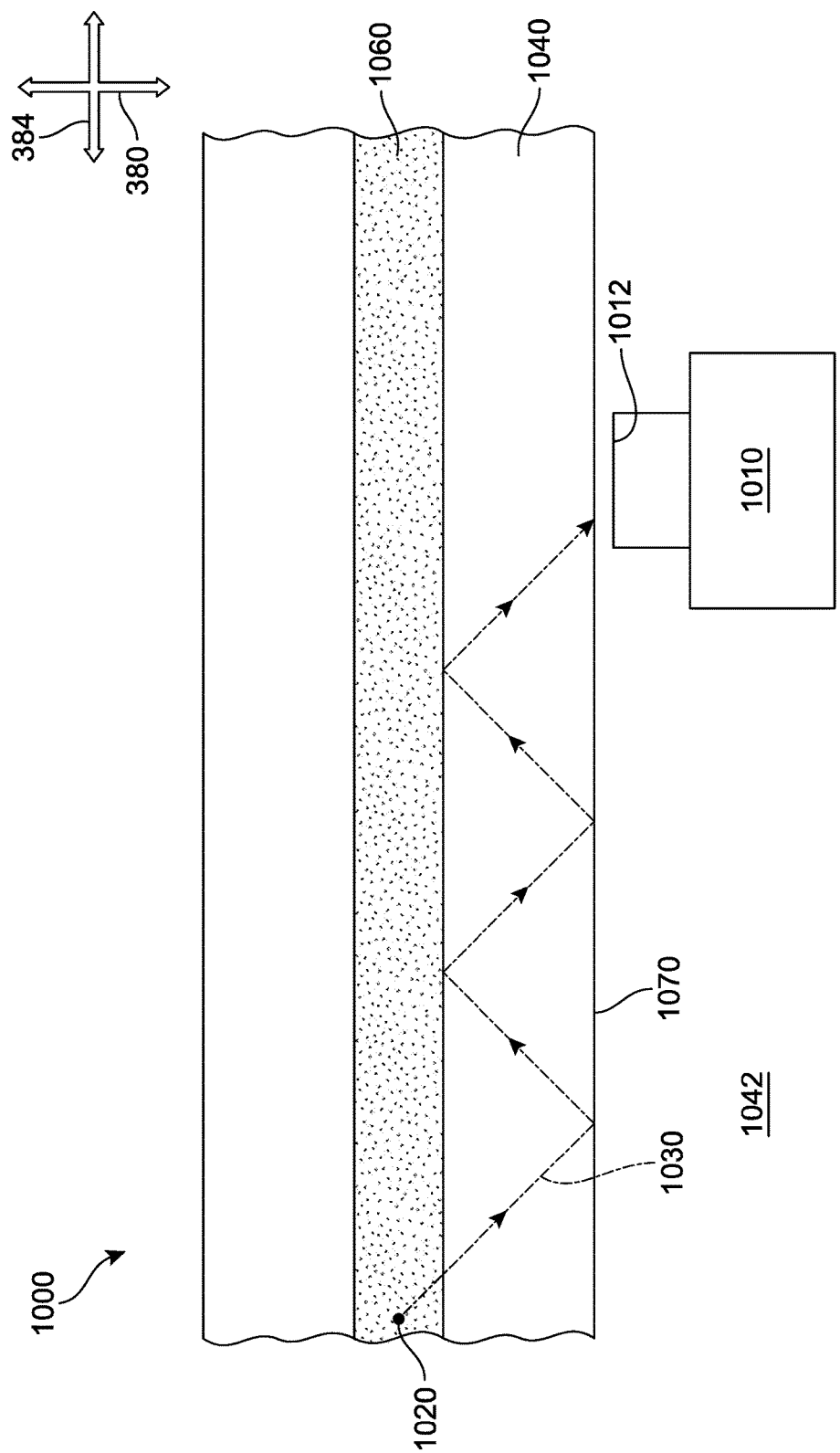
FIG. 10 is a cross-section view of an example of a portion of a display with a light sensor.
Figure 11:
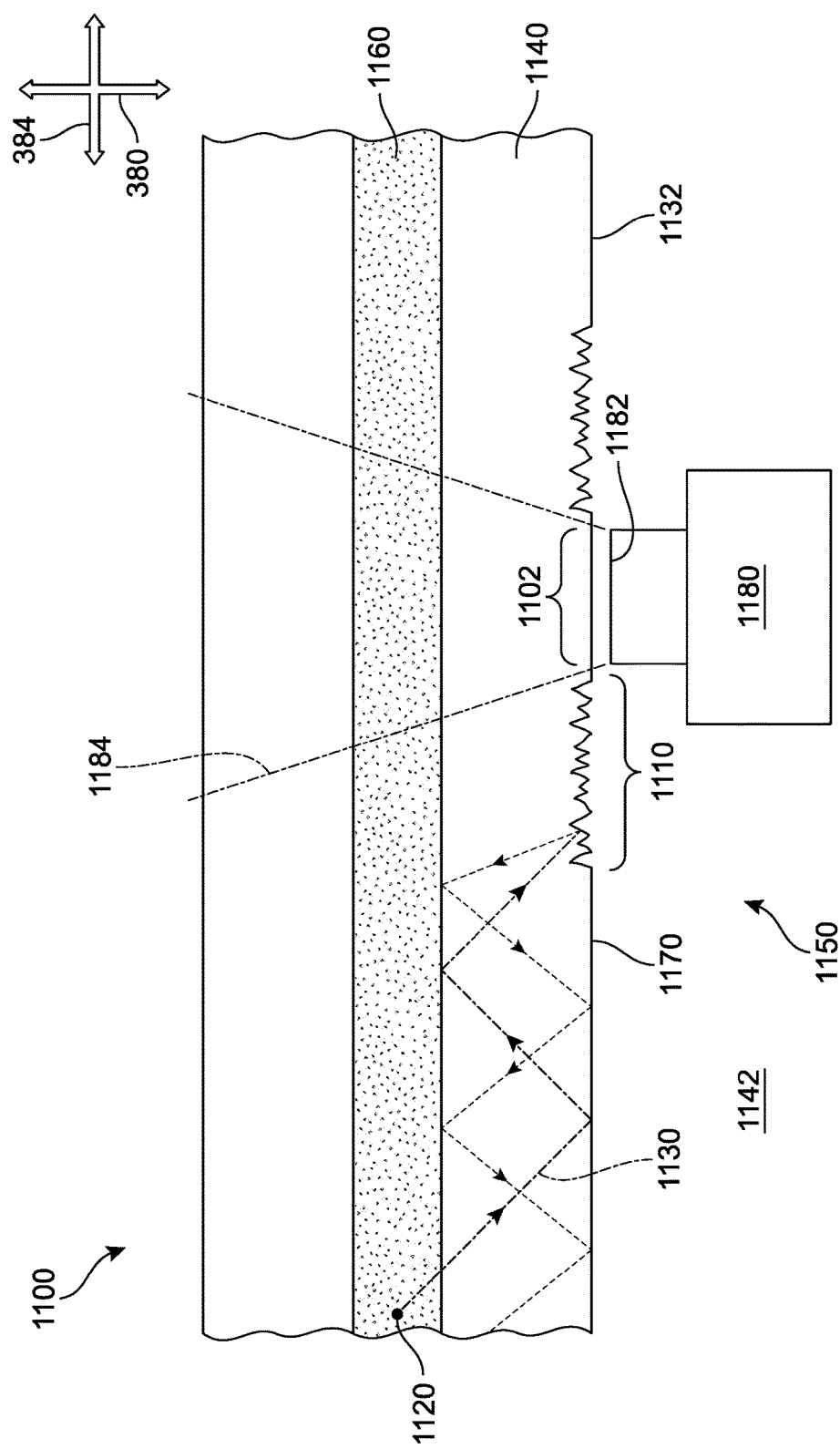
FIG. 11 is a cross-section view of an implementation of a portion of a fourth optical isolation system.

For purposes of clarity, an example of the optical disrupting properties of these regions is provided in FIGS. 10 and 11. FIGS. 10 and 11 are presented simply as a representation, and the lines representing the paths of light are for purposes of example only. Furthermore, though only two examples of light rays and internal reflection are provided, it should be understood that there may be other interfaces, surfaces, or structures by which light emitted by the light-emitting layer 1060 can be rerouted.

In FIG. 10, a portion of a fourth display 1000 is shown with a first image sensor 1010, where no optical isolation or disruption features are included. In FIG. 10, a first light source 1020 included in the display 1000 is emitting light, and an example first light ray 1030 is depicted as it is reflected through and along a back layer 1040, resulting in the image sensor 1010 experiencing optical crosstalk including light emitted by the light source 1020. Much as discussed in previous examples, light emitted by the light source 1020, as well as light emitted by other such light sources, may be directed through the display 1000 via reflections occurring and various material interfaces at various angles in addition to light ray 1030. While display light source 1020 can emit light in many directions, only one is shown for purposes of simplicity. The light ray 1030 can be understood to emanate from light source 1020 within the display 1000 (for example, a light-emitting subpixel or pixel element in light-emitting layer 1060). As described previously with respect to FIG. 2, some light may reflect off of various surfaces associated with the display as a result of internal reflections (including TIR) occurring at interfaces between different materials or secondary reflections from the mechanical assembly. In this example, the first light ray 1030 is shown moving at a downward angle until it strikes an interface 1070, here the interface between the back layer 1040 and an internal environment 1042 (for example, air). The first light ray 1030 then reflects back and subsequently moves along a zigzag path along and through the back layer 1040. Thus, in FIG. 10, light from the first light ray 1030 can travel from its light source 1020 to image receiving portion 1012 of image sensor 1010.

In FIG. 11, a fifth display 1100 is illustrated in which a fourth optical isolation system 1150 is included. In this case, the fourth optical isolation system 1150 includes an optical disruption region 1110 formed along a lower surface 1142 of a back layer 1140, similar to the first disrupting region described above with respect to FIG. 9. Where an FOV 1184 for the camera 1180 intersects with the lower surface 1132 of the back layer 1140 is an area of the lower surface that is adjacent to or directly across from the light receiving portion 1182 or light sensor 1180, referred to in FIG. 11 as a third zone 1102. The third zone 1102 can be substantially bounded or encircled by the patterns of the optical disrupting region in some implementations.

In contrast to the example of FIG. 10, as a second light source 1120 emits a second light ray 1130, the second light ray 1130 is scattered upon reaching optical disruption region 1110, rather than continuing its zigzag path toward the light sensor 1180. Thus, where in the absence of optical disrupting features adjacent to or proximate to a second camera 1180 the second light ray 1130 would enter the light receiving portion 1182 and affect measurements performed by the light sensor 1180, in this case the second light ray 1130 is blocked by the presence of the optical disruption region 1110, thereby isolating a light receiving portion 1182 of the second camera 1180 from the effects of optical crosstalk that would have been associated with the second light ray 1130.

Figure 12:
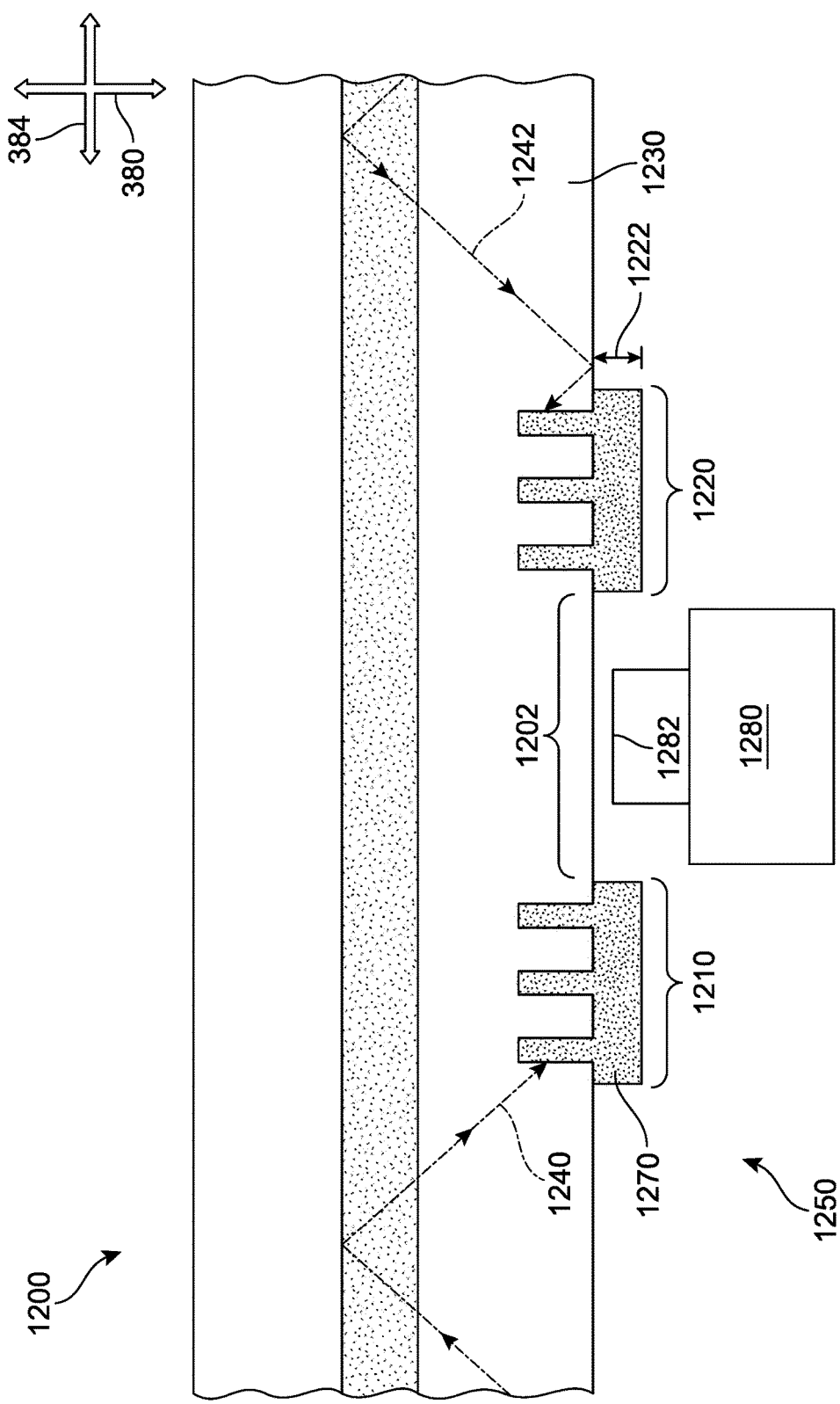
FIG. 12 is a cross-section view of an implementation of a portion of a fifth optical isolation system.

In different implementations, the optical disrupting features described herein can also include provisions for increasing or optimizing optical disrupting properties. In some implementations, the uneven surface regions or grooves described above may be filled or coated with a material that is substantially opaque to the wavelengths of the one or more light sources. In addition, the material may have a higher index of refraction than the material of the back layer. For example, the opaque material may include black paint or epoxy which is painted on or printed into the uneven portions or grooves. In other implementations, the opaque material can be directly deposited onto the outer surface of the back layer. FIG. 12 illustrates one example of a fifth optical isolation system 1250 in a sixth display 1200 that includes these features.

In FIG. 12, a back layer 1230 includes a third disrupting region 1210 and a fourth disrupting region 1220. The surface geometry of the third disrupting region 1210 and the fourth disrupting region 1220 may be similar to that of the second disrupting region 920 of FIG. 9. Furthermore, while the disrupting regions (third disrupting region 1210 and fourth disrupting region 1220) are identified in FIG. 12 as separate regions for purposes of the cross-sectional view, it should be understood that the grooves can be formed in the back layer such that they substantially surround the area associated with the camera. These grooves can encircle or otherwise bound a specific region or area, as described above. However, in other implementations, the grooves may not be substantially continuous, may change in shape or size as they border an area, may merge into or be formed adjacent to different types of optical disrupting features, such as the texturing described earlier, and/or may be arranged at varying depths around an area. For example, in FIG. 12, the grooves bound the fourth zone 1202 that is adjacent to or directly across from the camera lens. The third zone 1102 can be substantially bounded or encircled by the patterns of the optical disrupting region in some implementations.

In addition to the grooves formed in the back layer surface, in this example, each region has also been coated with a shielding material 1270 that has a higher index of refraction than the back layer 1230. Therefore, waveguided light within the sixth display 1200 that strikes the shielding material 1270 will be absorbed into the opaque shielding material, and prevented from reaching a third camera 1280. An example of this can be seen in the paths of a third light ray 1240 and a fourth light ray 1242, where the third light ray 1240 is absorbed by the third disrupting region 1210 and the fourth light ray 1242 is absorbed by the fourth disrupting region 1220.

Thus, in some implementations, it can be see that an optical isolation system can include an optical disrupting region that is formed directly on a surface of a display layer. This region can substantially encircle or surround a portion of the surface that is adjacent to, directly faces, or is across from the lens of the camera. These regions can include changes in thickness of the layer that can be at least partially filled in by a material that is optically opaque to wavelengths emitted by the light source. In some implementations, this material has an index of refraction higher than an index of refraction of the display layer. In one implementation, the material is a type of coating, such as a black, optically opaque paint.

In different implementations, the pattern of "rough" regions, grooves, and/or opaque materials can be configured to absorb waveguided light that is specific to the system in which the light is being emitted. For example, the number of grooves, the shape of the grooves, the amount of opaque filling material in a groove, the dimensions of the grooves, and/or the spacing between grooves may be selected based on the wavelength of light from the light sources so as to capture all or substantially all of the waveguided light. The filling of a groove can vary, and may completely fill a groove, or there may only be a coating on some portions of a groove. Similarly, the shape, dimensions, spacing, and other features of a roughened or textured region can vary to complement the particular display system being protected.

In other alternate implementations, it should be understood that an opaque material can also be deposited or coated primarily or only within the uneven cracks, openings, or recesses and/or any grooves that have been formed in the surface, and not be associated with any other outward or downward facing surface of the back layer. In another implementation, there may only be an opaque material that is deposited directly on the surface of the back layer, where no grooves or other uneven texturing is provided or formed in the layer. In such cases, the opaque material can be arranged to substantially surround the camera(s) and/or the camera's light capture region.

Figure 13:
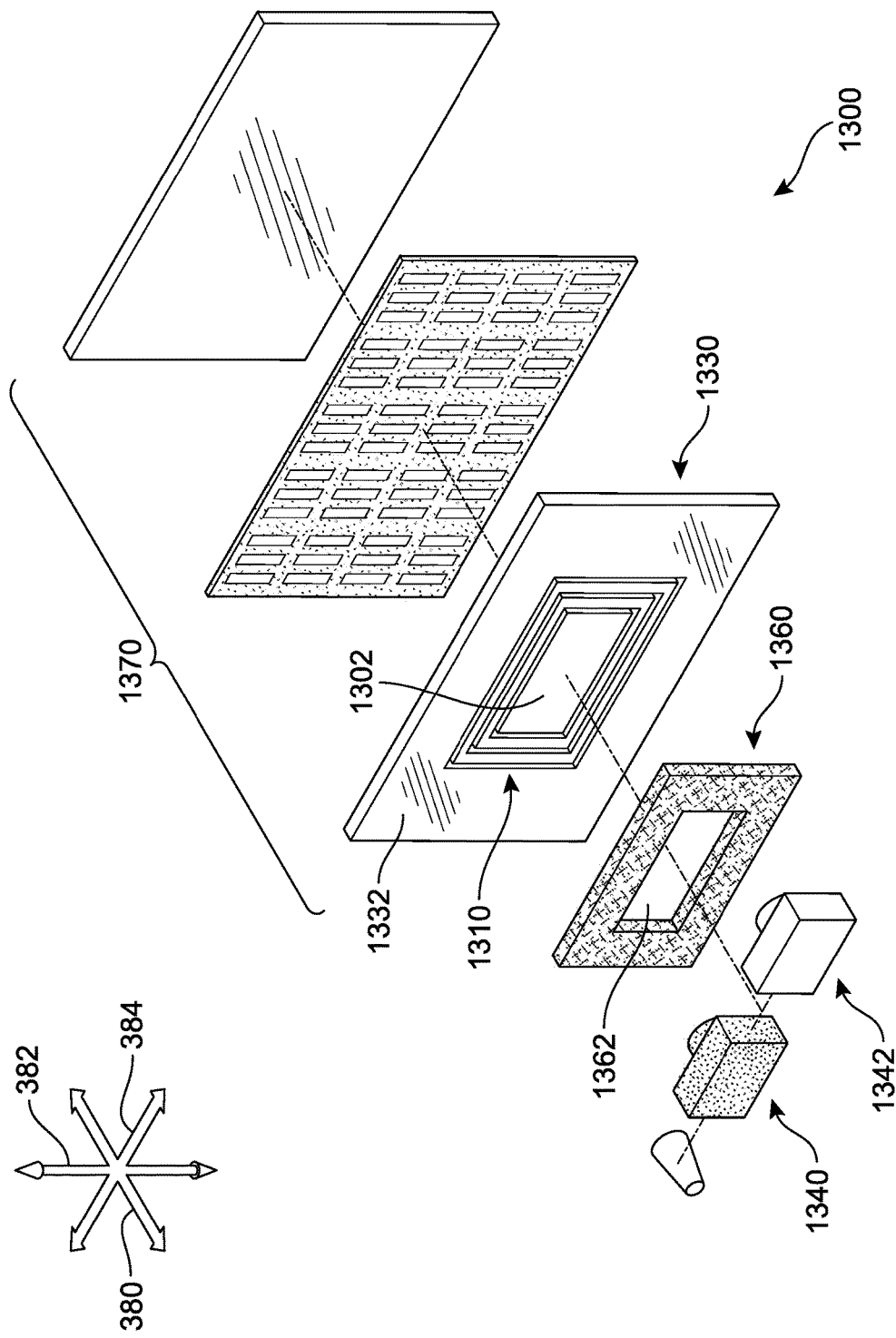
FIG. 13 is an exploded isometric view of an implementation of a sixth optical isolation system.

While the implementations described above have shown the various optical isolation features being associated or formed in the back layer, it should be understood that in other implementations any of these features can be provided on other display layers or adjacent components, including the OLED layer or other light-emitting layer, a front layer, and other layers found in LED, LCD, and various display systems. Furthermore, the optical disrupting regions and features described with reference to FIGS. 9-12 may be used in conjunction with the various implementations of the gasket described with reference to FIGS. 3-8. For example, referring to FIG. 13, a display system 1300 may include both a gasket 1360 and an optical disrupting region 1310 (here including a plurality of grooves formed on a lower surface 1332 of a back layer 1330). In this example, both the gasket 1360 and the optical disrupting region 1310 are arranged to substantially surround a fifth zone 1302 of back layer that is associated with light capture regions for both a first camera 1340 and a second camera 1342. Furthermore, it can be seen that an aperture 1362 in the gasket 1360 is substantially aligned with, adjacent to, and/or faces the fifth zone 1302. The gasket 1360 and optical disrupting region 1310 are arranged to help shield one or more cameras from light associated with the display 1370. In other implementations, there may be only one camera, or multiple cameras, and so the fifth zone 1302 can vary in shape and size. Furthermore, FIG. 13 is depicted for purposes of example only, and the optical disrupting region(s) and/or gasket can each vary, as described earlier. Through the inclusion of these features, a display system can minimize crosstalk for each camera.

Figure 14:
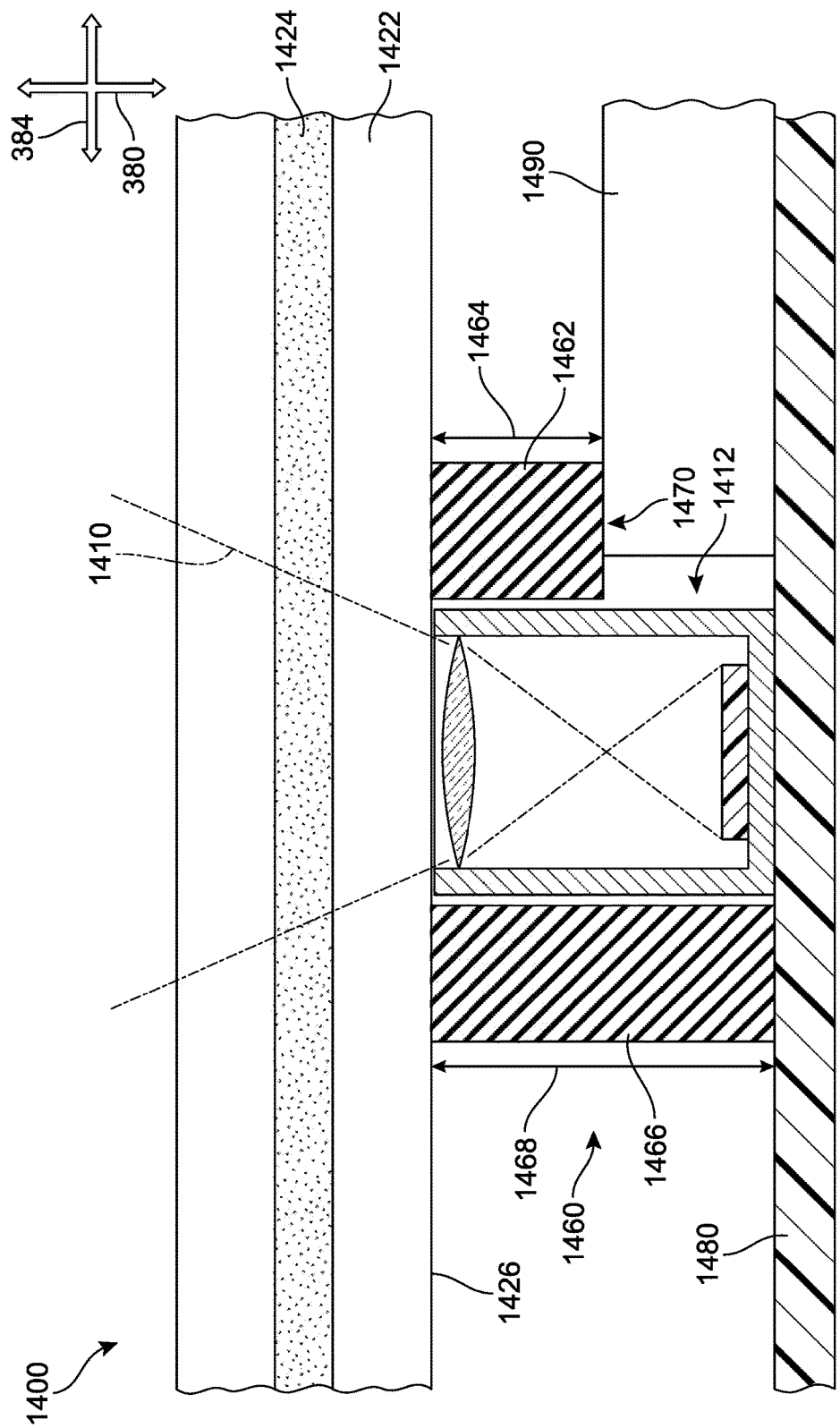
FIG. 14 is a cross-section view of an implementation of a portion of a seventh optical isolation system.

As discussed earlier, in some implementations, the optical system can include a gasket that is sized and dimensioned to accommodate the various components of the system. Referring to FIG. 14, a cross-section of a portion of a seventh optical system ("seventh system") 1400 is illustrated. The seventh system 1400 can be understood to include similar features and properties as those described earlier. For purposes of clarity, FIG. 4 is presented with reference to lateral axis 384 and vertical axis 380. An RGB camera 1412 is disposed below a back layer 1422. In addition, in this example, a gasket 1460 is disposed beneath back layer 1422, and the light-emitting layer 1424 is disposed above the back layer 1422. In one implementation, the light-emitting layer 1424 is mounted in close proximity to the front layer. Furthermore, in some implementations, at least a portion of the RGB camera 1412 can be in intimate contact with or close proximity to the back layer 1422, as shown in FIG. 14. As noted earlier this proximity can position the light receiving portion of the camera in more intimate contact or closer proximity to the back layer 1422. In FIG. 14, an uppermost portion of the RGB camera 1412 can touch a lower side or lower surface 1426 of the back layer 1422 or other rearmost layer of the display.

In FIG. 14, a general representation of an FOV 1410 of the RGB camera 1412 is depicted by dashed lines extending upward. The FOV 1410 can vary in different implementations, depending on a camera or other light sensor module that is selected for use in the display system. It should be understood that the FOV 1410 is shown as an example only, and in some implementations may correspond to only a portion of angles via which light rays may impinge on the light receiving portion and affect measurements performed by the RGB camera 1412.

Referring again to FIG. 14, portions of a first segment 1466 and a second segment 1462 of the gasket 1460 are also shown, depicted in the cross-section as being arranged on opposite sides of the RGB camera 1412. It should be understood that while the first segment 1466 and the second segment 1462 are shown as discrete portions in the cross-sectional view, they represent portions of a single gasket that extends substantially continuously around the camera. The first segment 1466 has a first thickness 1468 and the second segment 1462 has a second thickness 1464. As noted above, in some implementations, the first thickness 1468 and the second thickness 1464 can differ. Thus, as illustrated in FIG. 14, the thickness of the gasket 1460 varies as it extends around the camera. In this example, the first segment 1466 has a thickness that extends substantially between the back layer 1422 and a circuit board 1480 upon which the RGB camera 1412 is disposed. In contrast, the second segment 1462 has a thickness that extends substantially between the back layer 1422 and an upper surface 1470 of a structure 1490, where the structure 1490 can be understood to be any component or object that is integrated, connected to, or disposed on the circuit board 1480. Thus, a thickness of the gasket can vary widely in different optical systems.

It is noted that as a result of the placement of the gasket between components during assembly of the device compression may occur, whereby the material of the gasket at such positions may be compressed and the thickness reduced. Thus, in some examples, the actual thickness of various portions of the gasket may be greater than the distance between the back layer 1422 and the circuit board 1480. Similarly, the thickness may be greater than the distance between the back layer 1422 and the structure 1490, or other components disposed adjacent to the gasket. This manufacturing approach ensures that there is not a gap between the various surfaces. It may also reduce the influence of parts tolerances that might otherwise in a gap between the surfaces of the gasket and other adjacent surfaces of the system. The features, structures, and/or properties described with respect to the implementation shown in FIG. 14 may be applicable to the implementations discussed above with respect to FIGS. 1-13.

In different implementations, the optical isolation systems disclosed above can be used in conjunction with a variety of additional features or approaches to improve the integration of a camera with the display. In some implementations, this can involve synchronization of the camera exposure with display illumination. In particular, such synchronization may be configured to occur in the portion of the display that covers the camera field of view. In other cases, the display frame rate or other display time parameters can be adjusted to minimize crosstalk.

For example, in some implementations, the display system may be configured to permit an interleaving of display timing with camera exposure times. In one implementation, this approach would only be employed in the region of the display that is associated with and/or covering the camera module and light sensor. Similarly, in some implementations, when the camera module is running, the display pixels in the region that are blocking the field of view of the camera may be switched off. In another implementation, the frame rate of the display can be dropped in the region of the display that covers the field of view of the camera. In addition, in other implementations, display timing can be altered, reducing the exposure time of the display in the portion of the display associated with the field of view of the camera and increasing the exposure time of the camera, further reducing optical crosstalk form the display to the camera. In another implementation, in order to increase performance of the infrared sensor camera, the infrared bandpass filter and pixel design can be optimized to block RGB display light, thus allowing the display and IR sensor to run concurrently.

Furthermore, implementations of the present disclosure can make use of any of the systems, components, devices, and methods described in U.S. Patent Publication Number 2016/0337570 to Tan et al., published Nov. 17, 2016 and titled "Camera Included in Display," the disclosure of which is herein incorporated by reference in its entirety. Other implementations may make use of the features described in U.S. Patent Publication Number 2015/0271392 to Musgrave et al., published Sep. 24, 2015, and titled "System and Method for Coordinating Image Capture in a Camera Hidden Behind a Display Device," and U.S. Pat. No. 9,057,931 to Baldwin, issued Jun. 16, 2015, and titled "Display Integrated Camera," both of these applications being herein incorporated by reference in their entirety.

For example, in some implementations, the duty cycle of the display can be adjusted to increase or decrease the brightness of portions of the display. This approach can be useful during image capture. The camera and display assembly can be self-gating, with the exposure time being tied to the duty cycle of the display screen. In some implementations, the camera exposure circuitry can be tied to the display modulation circuitry for the appropriate synchronization. Similarly, in some implementations, the display zone associated with the integrated camera may be controlled with a contextual refresh rate configured to coordinate image display with camera usage. The rasterizing frequency or refresh rate of image display on the thin film display device may be modified to accommodate image taking by the camera oriented behind the outer display field layer. Such alterations to raster rate or refresh rate, backlighting in LCD applications, and permitting the outer display field layer to receive light can be limited to the camera zone, a portion of the outer display field layer, or the entire outer display field layer. In other implementations, the zone associated with the camera may be made transparent during camera image capture functions. Similarly, in other implementations, the system can incorporate a time division approach, where the display is configured to be selectively dimmed in the camera's zone or field of view during the camera capture periods, thereby reducing crosstalk that would otherwise be observed by the camera. In some implementations, regions surrounding the camera zone may have gradually decreasing amounts of dimming.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus the following claims are hereby incorporated into the Detailed Description, with each claim standing on its own as a separately claimed subject matter.

What is claimed is:

1. An optical isolation system for reducing an amount of light transmitted from a light source in a display to a light receiving portion of a light sensor positioned behind the display, the optical isolation system comprising:
    a gasket, the gasket defining an aperture, wherein:
        the display includes a substantially two-dimensional first layer that extends along a horizontal plane;
        the gasket is attached to the first layer and is disposed between the light source and the light receiving portion of the light sensor,
        the aperture defined by the gasket has a first area along the horizontal plane, the light receiving portion receives light through a lens opening that has a second area along the horizontal plane, and the first area is equal to or greater than the second area,
        the lens opening of the light receiving portion is substantially aligned with the aperture,
        the gasket includes a material that has a higher index of refraction than that of an adjacent layer of the display, and
        the material of the gasket resides outside of the lens opening and outside of a field of view of the light sensor, and
    an optical disrupting region including one or more grooves formed in the first layer and surrounding a perimeter of the gasket.

2. The optical isolation system of claim 1, wherein the gasket has a substantially rectangular shape.

3. The optical isolation system of claim 1, wherein the light sensor is an RGB camera.

4. The optical isolation system of claim 1, wherein the display is an organic light-emitting diode (OLED) display with a light-emitting layer, and wherein the light source includes one or more light-emitting pixels and/or subpixels.

5. The optical isolation system of claim 4, wherein the gasket includes a first thickness that is at least 1.5 times greater than a second thickness of the OLED display.

6. The optical isolation system of claim 1, wherein:
    the first layer includes a lower surface providing a rear surface of the display that faces toward the light receiving portion of the light sensor; and
    the gasket is attached to the lower surface of the first layer.

7. The optical isolation system of claim 6, wherein the lower surface further includes the optical disrupting region.

8. The optical isolation system of claim 1, wherein the optical disrupting region includes a portion of a lower surface of the first layer that is substantially uneven.

9. The optical isolation system of claim 1, wherein:
    the aperture is an opening formed in the gasket that extends along a horizontal plane; and
    the light sensor is substantially aligned perpendicular to the horizontal plane.

10. An optical isolation system for reducing an amount of light transmitted from a first light source in a display to two cameras positioned behind the display, including a first camera and a second camera, the optical isolation system comprising:
    a gasket, the gasket defining an aperture, wherein:
        the display includes a substantially two-dimensional first layer that extends along a horizontal plane;
        the gasket is attached to the first layer and is disposed between the light source and the two cameras,
        the aperture has a first zone with an area that is equal to or greater than an area of a second zone of the display that encompasses both a first field of view of the first camera and a second field of view of the second camera,
        the gasket includes a material that has a higher index of refraction than that of an adjacent layer of the display, and
        the first zone of the aperture defined by the gasket is substantially aligned with the second zone corresponding to the first field of view and the second field of view, such that the material having the higher index of refraction resides outside of the second zone, and
    an optical disrupting region including one or more grooves formed in the first layer and surrounding a perimeter of the gasket.

11. The optical isolation system of claim 10, wherein the first camera is an infrared camera and the second camera is an RGB camera.

12. The optical isolation system of claim 10, wherein the gasket is further configured to reduce an amount of light transmitted from a second light source to the two cameras, the second light source being an infrared light source positioned behind the display.

13. The optical isolation system of claim 12, wherein the gasket includes a material that is opaque to wavelengths emitted by the second light source.

14. An optical isolation system comprising:
a light sensor; and
a display including a light source and at least a first layer, wherein:
the first layer includes a lower surface providing a rear surface of the display,
the light sensor is positioned behind the rear surface of the display,
the lower surface includes a first zone that is adjacent to a gasket disposed between the first zone and a light receiving portion of the light sensor,
the first layer includes an optical disrupting region including a pattern of one or more grooves formed through a thickness of the first layer, the optical disrupting region extends around a perimeter of the gasket and is arranged outside of the first zone, such that the optical disrupting region resides outside the light receiving portion of the light sensor and outside a field of view of the sensor, and
the optical disrupting region being coated with a material that has a higher index of refraction than that of the first layer.

15. The optical isolation system of claim 14, wherein the material at least partially fills the pattern of one or more grooves.

16. The optical isolation system of claim 14, wherein the optical disrupting region further comprises a portion of the lower surface that is substantially uneven and includes variations in a thickness of the first layer.

17. The optical isolation system of claim 14, wherein the material has an index of refraction greater than an index of refraction of the first layer.

* * * * *